US010534034B2

(12) United States Patent
Froelich et al.

(10) Patent No.: US 10,534,034 B2
(45) Date of Patent: Jan. 14, 2020

(54) INTERCONNECT RETIMER ENHANCEMENTS

(71) Applicant: Intel Corporation, Santa Clara, CA (US)

(72) Inventors: Daniel S. Froelich, Portland, OR (US); Debendra Das Sharma, Saratoga, CA (US)

(73) Assignee: Intel Corporation, Santa Clara, CA (US)

(*) Notice: Subject to any disclaimer, the term of this patent is extended or adjusted under 35 U.S.C. 154(b) by 465 days.

(21) Appl. No.: 15/039,515

(22) PCT Filed: Dec. 26, 2013

(86) PCT No.: PCT/US2013/077806
§ 371 (c)(1),
(2) Date: May 26, 2016

(87) PCT Pub. No.: WO2015/099733
PCT Pub. Date: Jul. 2, 2015

(65) Prior Publication Data
US 2016/0377679 A1 Dec. 29, 2016

(51) Int. Cl.
G01R 31/317 (2006.01)
H04B 3/46 (2015.01)
(Continued)

(52) U.S. Cl.
CPC ... *G01R 31/31703* (2013.01); *G01R 31/3177* (2013.01); *G01R 31/31725* (2013.01);
(Continued)

(58) Field of Classification Search
CPC .......... H01L 2225/06596; H01L 22/34; G06F 13/1689; G06F 11/2205; G06F 11/3688;
(Continued)

(56) References Cited

U.S. PATENT DOCUMENTS 8,627,156 B1 * 1/2014 Erickson ................. H04L 1/244
714/707
2004/0047408 A1 3/2004 Koenenkamp et al.
(Continued)

FOREIGN PATENT DOCUMENTS

CN 101882986 A 11/2010
EP 0516042 A2 12/1992
(Continued)

OTHER PUBLICATIONS

JPO Notification of Reasons for Refusal issued in JP Patent Application No. 2016-532603 dated Aug. 2, 2017 (2 pages) with English translation (3 pages).
(Continued)

*Primary Examiner* — Cynthia Britt
*Assistant Examiner* — Sazzad Hossain
(74) *Attorney, Agent, or Firm* — Alliance IP, LLC

(57) ABSTRACT

A test mode signal is generated to include a test pattern and an error reporting sequence. The test mode signal is sent on link that includes one or more extension devices and two or more sublinks. The test mode signal is to be sent on a particular one of the sublinks and is to be used by a receiving device to identify errors on the particular sublink. The error reporting sequence is to be encoded with error information to describe error status of sublinks in the plurality of sublinks.

23 Claims, 21 Drawing Sheets

(51) Int. Cl.
- G06F 11/22 (2006.01)
- G01R 31/3177 (2006.01)
- G06F 11/36 (2006.01)
- H01L 21/66 (2006.01)
- G06F 11/00 (2006.01)
- G06F 13/16 (2006.01)
- G01R 31/28 (2006.01)
- G01R 31/327 (2006.01)
- G06F 11/07 (2006.01)

(52) U.S. Cl.
CPC ............ *G06F 11/221* (2013.01); *H04B 3/46* (2013.01); *G01R 31/2851* (2013.01); *G01R 31/3275* (2013.01); *G06F 11/00* (2013.01); *G06F 11/0751* (2013.01); *G06F 11/2205* (2013.01); *G06F 11/3688* (2013.01); *G06F 13/1689* (2013.01); *H01L 22/34* (2013.01); *H01L 2225/06596* (2013.01)

(58) Field of Classification Search
CPC . G06F 11/00; G06F 11/0751; G01R 31/3177; G01R 31/2851; G01R 31/31703; G01R 31/3275; G01R 31/31725
See application file for complete search history.

(56) References Cited

U.S. PATENT DOCUMENTS

| | | |
|---|---|---|
| 2005/0149656 A1 | 7/2005 | Seto |
| 2006/0095216 A1* | 5/2006 | Reintjes ............... G01D 18/008 702/35 |
| 2007/0087615 A1 | 4/2007 | Paulsen et al. |
| 2007/0234139 A1* | 10/2007 | Kalantri .................. H04L 1/244 714/712 |
| 2008/0037526 A1* | 2/2008 | Dong .................. H04L 12/2697 370/352 |
| 2008/0074992 A1 | 3/2008 | Sams et al. |
| 2010/0027559 A1* | 2/2010 | Lin ....................... G06F 13/385 370/463 |
| 2010/0153799 A1* | 6/2010 | Maroni ............... G06F 11/2733 714/735 |
| 2013/0080829 A1 | 3/2013 | Colline |
| 2015/0113334 A1* | 4/2015 | Raj ..................... G06F 11/0787 714/45 |

FOREIGN PATENT DOCUMENTS

| | | |
|---|---|---|
| JP | 03276942 | 12/1991 |
| JP | 1996111682 | 4/1996 |
| JP | 2011239219 A | 11/2011 |
| WO | 2015099733 A1 | 7/2015 |

OTHER PUBLICATIONS

KIPO Notice of Preliminary Rejection issued in KR Patent Application No. 2016-7013931 dated Sep. 1, 2017 (5 pages) with English translation (4 pages).

European Search Report for EP Application 13900111.9 dated Sep. 18, 2017, 9 pages.

KIPO Final Rejection issued in KR Patent Application No. 2016-7013931 dated Mar. 23, 2018 (3 pages) with English translation (3 pages).

KIPO Office Action after RCE issued in KR Patent Application No. 2016-7013931 dated May 28, 2018 (5 pages) with English translation (5 pages).

PCI Express, cited in SIPO Notice of First Office Action for CN Patent Application No. 201380081246.X, dated Mar. 31, 2010, 9 pages.

SIPO Notice of First Office Action issued in CNPatent Application No. 201380081246.X dated Apr. 11, 2018 (8 pages).

PCT International Search Report and Written Opinion in International Application No. PCT/US2013/077806 dated Sep. 24, 2014.

International Preliminary Report on Patentability in International Application No. PCT/US2013/077806 dated Jun. 28, 2016.

IP India Examination Report issued in IN Patent Application No. 201647015621 dated Feb. 5, 2019 with English translation (6 pages).

* cited by examiner

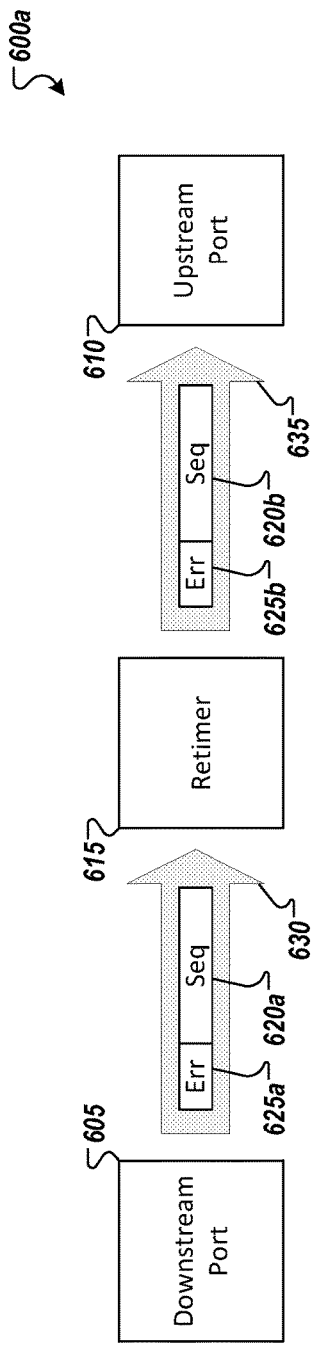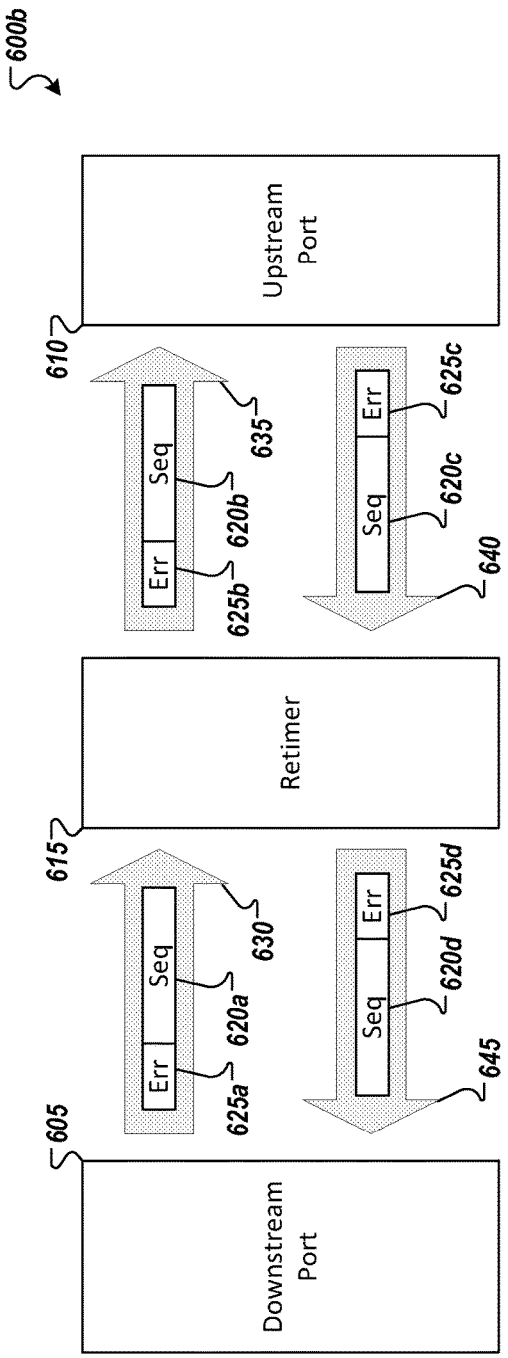

700

| Symbol Number | Value | Description |
|---|---|---|
| 0 through (4*N - 1) [N can be 1 through 5] | AAh | SKP Symbol. Symbol 0 is the SKP Ordered Set identifier. |
| 4*N | E1h | SKP_END Symbol. Signifies the end of the SKP Ordered Set after three more Symbols. |
| 4*N + 1 | 00-FFh | (i) If LTSSM state is Polling.Compliance: AAh<br>(ii) If LTSSM state is Loopback:<br>SubLink_Error_Status[7:0]<br>(iii) Else if prior block was a Data Block:<br>    Bit[7] = Data Parity<br>    Bit[6:0] = LFSR[22:16]<br>(iv) Else:<br>    Bit[7] = ~LFSR[22]<br>    Bit[6:0] = LFSR[22:16] |
| 4*N + 2 | 00-FFh | (i) If the LTSSM state is Polling.Compliance: Error_Status[7:0]<br>(ii) If LTSSM state is Loopback:<br>SubLink_Error_Status[7:0]<br>(iii) Else LFSR[15:8] |
| 4*N + 3 | 00-FFh | (i) If the LTSSM state is Polling.Compliance: ~Error_Status[7:0]<br>(ii) If LTSSM state is Loopback:<br>SubLink_Error_Status[7:0]<br>(iii) Else: LFSR[7:0] |

705 — row for 4*N<br>
710 — row for 4*N + 1<br>
715 — row for 4*N + 2

*FIG. 7*

INTERCONNECT RETIMER ENHANCEMENTS

CROSS-REFERENCE TO RELATED APPLICATIONS

This Application is a national stage application under 35 U.S.C. § 371 of PCT Application PCT/US2013/077806, filed on Dec. 26, 2013 and entitled "Interconnect Retimer Enhancements", which is incorporated by reference in its entirety. The disclosures of the prior application is considered part of and is hereby incorporated by reference in its entirety in the disclosure of this application.

FIELD

This disclosure pertains to computing system, and in particular (but not exclusively) to point-to-point interconnects.

BACKGROUND

Advances in semi-conductor processing and logic design have permitted an increase in the amount of logic that may be present on integrated circuit devices. As a corollary, computer system configurations have evolved from a single or multiple integrated circuits in a system to multiple cores, multiple hardware threads, and multiple logical processors present on individual integrated circuits, as well as other interfaces integrated within such processors. A processor or integrated circuit typically comprises a single physical processor die, where the processor die may include any number of cores, hardware threads, logical processors, interfaces, memory, controller hubs, etc.

As a result of the greater ability to fit more processing power in smaller packages, smaller computing devices have increased in popularity. Smartphones, tablets, ultrathin notebooks, and other user equipment have grown exponentially. However, these smaller devices are reliant on servers both for data storage and complex processing that exceeds the form factor. Consequently, the demand in the high-performance computing market (i.e. server space) has also increased. For instance, in modern servers, there is typically not only a single processor with multiple cores, but also multiple physical processors (also referred to as multiple sockets) to increase the computing power. But as the processing power grows along with the number of devices in a computing system, the communication between sockets and other devices becomes more critical.

In fact, interconnects have grown from more traditional multi-drop buses that primarily handled electrical communications to full blown interconnect architectures that facilitate fast communication. Unfortunately, as the demand for future processors to consume at even higher-rates corresponding demand is placed on the capabilities of existing interconnect architectures.

BRIEF DESCRIPTION OF THE DRAWINGS

FIGS. 6A-6E illustrate simplified block diagrams of example implementations of a test mode for determining errors in one or more sublinks of a link.

FIG. 7 illustrates a representation of an example ordered set.

DETAILED DESCRIPTION

Figure 1:
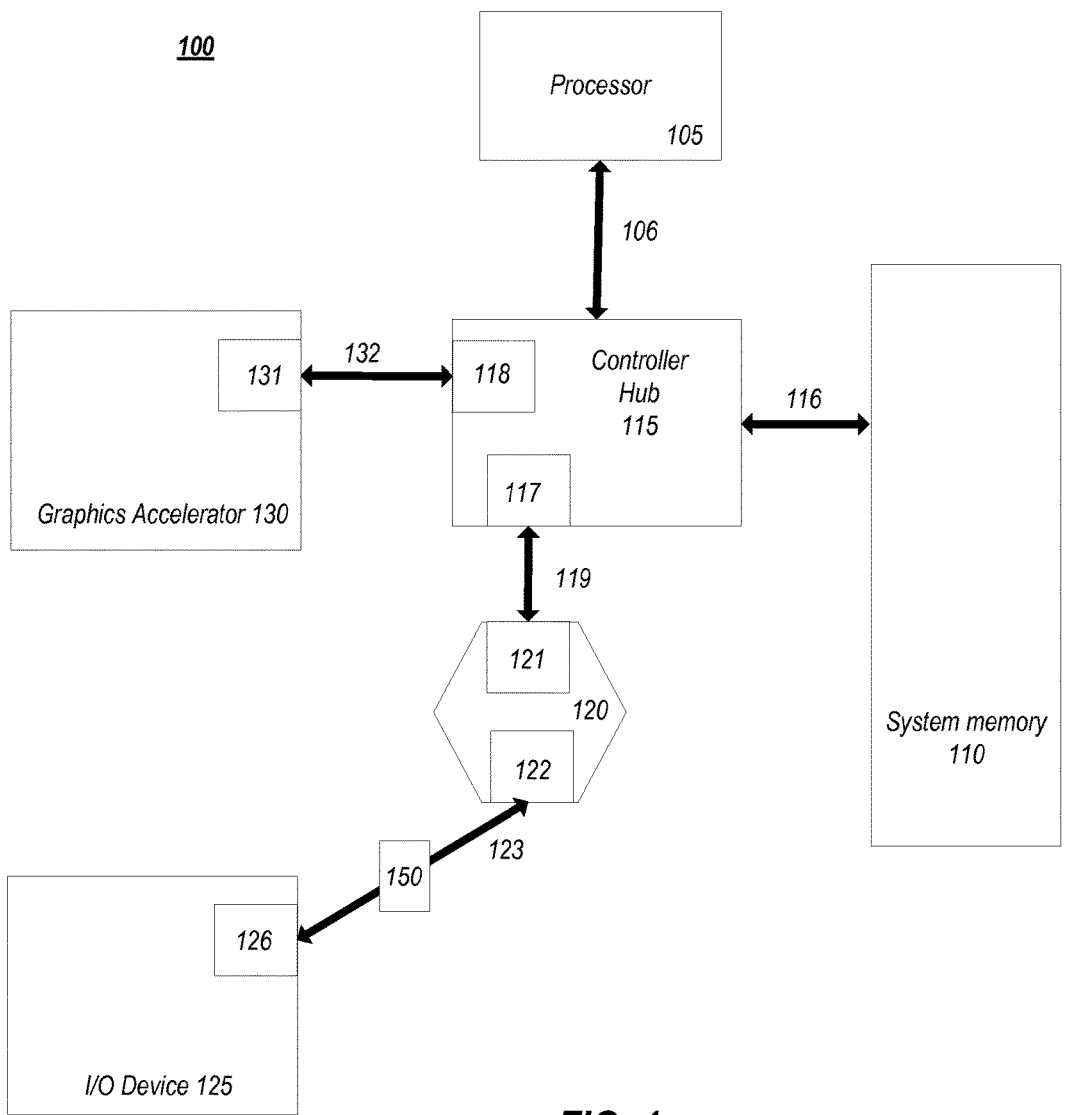
FIG. 1 illustrates an embodiment of a computing system including an interconnect architecture.

In the following description, numerous specific details are set forth, such as examples of specific types of processors and system configurations, specific hardware structures, specific architectural and micro architectural details, specific register configurations, specific instruction types, specific system components, specific measurements/heights, specific processor pipeline stages and operation etc. in order to provide a thorough understanding of the present invention. It will be apparent, however, to one skilled in the art that these specific details need not be employed to practice the present invention. In other instances, well known components or methods, such as specific and alternative processor architectures, specific logic circuits/code for described algorithms, specific firmware code, specific interconnect operation, specific logic configurations, specific manufacturing techniques and materials, specific compiler implementations, specific expression of algorithms in code, specific power down and gating techniques/logic and other specific operational details of computer system haven't been described in detail in order to avoid unnecessarily obscuring the present invention.

Although the following embodiments may be described with reference to energy conservation and energy efficiency in specific integrated circuits, such as in computing platforms or microprocessors, other embodiments are applicable to other types of integrated circuits and logic devices. Similar techniques and teachings of embodiments described herein may be applied to other types of circuits or semiconductor devices that may also benefit from better energy efficiency and energy conservation. For example, the disclosed embodiments are not limited to desktop computer systems or Ultrabooks™. And may be also used in other devices, such as handheld devices, tablets, other thin notebooks, systems on a chip (SOC) devices, and embedded applications. Some examples of handheld devices include cellular phones, Internet protocol devices, digital cameras, personal digital assistants (PDAs), and handheld PCs. Embedded applications typically include a microcontroller, a digital signal processor (DSP), a system on a chip, network computers (NetPC), set-top boxes, network hubs, wide area network (WAN) switches, or any other system that can perform the functions and operations taught below. Moreover, the apparatus', methods, and systems described herein are not limited to physical computing devices, but may also relate to software optimizations for energy conservation and efficiency. As will become readily apparent in the description below, the embodiments of methods, apparatus', and systems described herein (whether in reference to hardware, firmware, software, or a combination thereof) are vital to a 'green technology' future balanced with performance considerations.

As computing systems are advancing, the components therein are becoming more complex. As a result, the interconnect architecture to couple and communicate between the components is also increasing in complexity to ensure bandwidth requirements are met for optimal component operation. Furthermore, different market segments demand different aspects of interconnect architectures to suit the market's needs. For example, servers require higher performance, while the mobile ecosystem is sometimes able to sacrifice overall performance for power savings. Yet, it's a singular purpose of most fabrics to provide highest possible performance with maximum power saving. Below, a number of interconnects are discussed, which would potentially benefit from aspects of the invention described herein.

One interconnect fabric architecture includes the Peripheral Component Interconnect (PCI) Express (PCIe) architecture. A primary goal of PCIe is to enable components and devices from different vendors to inter-operate in an open architecture, spanning multiple market segments; Clients (Desktops and Mobile), Servers (Standard and Enterprise), and Embedded and Communication devices. PCI Express is a high performance, general purpose I/O interconnect defined for a wide variety of future computing and communication platforms. Some PCI attributes, such as its usage model, load-store architecture, and software interfaces, have been maintained through its revisions, whereas previous parallel bus implementations have been replaced by a highly scalable, fully serial interface. The more recent versions of PCI Express take advantage of advances in point-to-point interconnects, Switch-based technology, and packetized protocol to deliver new levels of performance and features. Power Management, Quality Of Service (QoS), Hot-Plug/Hot-Swap support, Data Integrity, and Error Handling are among some of the advanced features supported by PCI Express.

Referring to FIG. 1, an embodiment of a fabric composed of point-to-point Links that interconnect a set of components is illustrated. System 100 includes processor 105 and system memory 110 coupled to controller hub 115. Processor 105 includes any processing element, such as a microprocessor, a host processor, an embedded processor, a co-processor, or other processor. Processor 105 is coupled to controller hub 115 through front-side bus (FSB) 106. In one embodiment, FSB 106 is a serial point-to-point interconnect as described below. In another embodiment, link 106 includes a serial, differential interconnect architecture that is compliant with different interconnect standard.

System memory 110 includes any memory device, such as random access memory (RAM), non-volatile (NV) memory, or other memory accessible by devices in system 100. System memory 110 is coupled to controller hub 115 through memory interface 116. Examples of a memory interface include a double-data rate (DDR) memory interface, a dual-channel DDR memory interface, and a dynamic RAM (DRAM) memory interface.

In one embodiment, controller hub 115 is a root hub, root complex, or root controller in a Peripheral Component Interconnect Express (PCIe or PCIE) interconnection hierarchy. Examples of controller hub 115 include a chipset, a memory controller hub (MCH), a northbridge, an interconnect controller hub (ICH) a southbridge, and a root controller/hub. Often the term chipset refers to two physically separate controller hubs, i.e. a memory controller hub (MCH) coupled to an interconnect controller hub (ICH). Note that current systems often include the MCH integrated with processor 105, while controller 115 is to communicate with I/O devices, in a similar manner as described below. In some embodiments, peer-to-peer routing is optionally supported through root complex 115.

Here, controller hub 115 is coupled to switch/bridge 120 through serial link 119. Input/output modules 117 and 121, which may also be referred to as interfaces/ports 117 and 121, include/implement a layered protocol stack to provide communication between controller hub 115 and switch 120. In one embodiment, multiple devices are capable of being coupled to switch 120.

Switch/bridge 120 routes packets/messages from device 125 upstream, i.e. up a hierarchy towards a root complex, to controller hub 115 and downstream, i.e. down a hierarchy away from a root controller, from processor 105 or system memory 110 to device 125. Switch 120, in one embodiment, is referred to as a logical assembly of multiple virtual PCI-to-PCI bridge devices. Device 125 includes any internal or external device or component to be coupled to an electronic system, such as an I/O device, a Network Interface Controller (NIC), an add-in card, an audio processor, a network processor, a hard-drive, a storage device, a CD/DVD ROM, a monitor, a printer, a mouse, a keyboard, a router, a portable storage device, a Firewire device, a Universal Serial Bus (USB) device, a scanner, and other input/output devices. Often in the PCIe vernacular, such as device, is referred to as an endpoint. Although not specifically shown, device 125 may include a PCIe to PCI/PCI-X bridge to support legacy or other version PCI devices. Endpoint devices in PCIe are often classified as legacy, PCIe, or root complex integrated endpoints.

Graphics accelerator 130 is also coupled to controller hub 115 through serial link 132. In one embodiment, graphics accelerator 130 is coupled to an MCH, which is coupled to an ICH. Switch 120, and accordingly I/O device 125, is then coupled to the ICH. I/O modules 131 and 118 are also to implement a layered protocol stack to communicate between graphics accelerator 130 and controller hub 115. Similar to the MCH discussion above, a graphics controller or the graphics accelerator 130 itself may be integrated in processor 105. Further, one or more links (e.g., 123) of the system can include one or more extension devices (e.g., 150), such as retimers, repeaters, etc.

Figure 2:
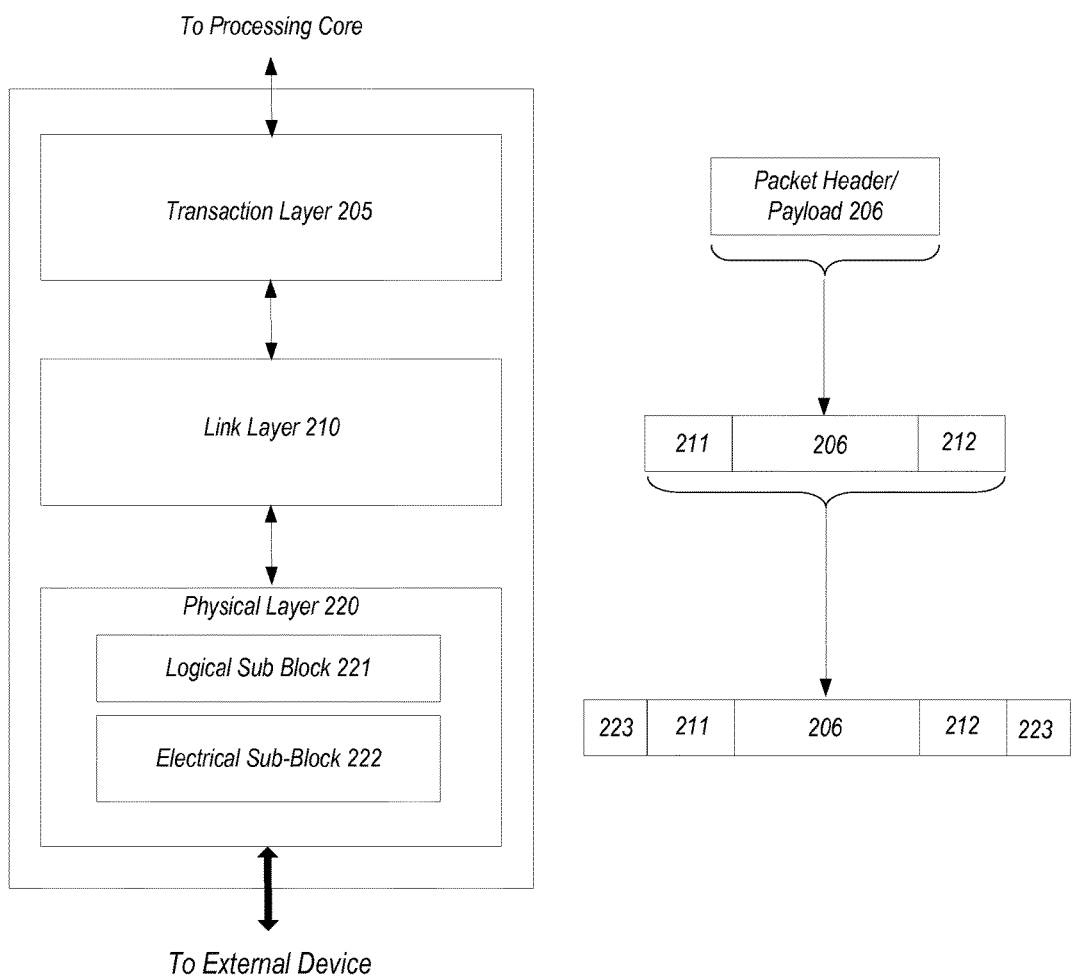
FIG. 2 illustrates an embodiment of a interconnect architecture including a layered stack.

Turning to FIG. 2 an embodiment of a layered protocol stack is illustrated. Layered protocol stack 200 includes any form of a layered communication stack, such as a Quick Path Interconnect (QPI) stack, a PCie stack, a next generation high performance computing interconnect stack, or other layered stack. Although the discussion immediately below in reference to FIGS. 1-4 are in relation to a PCIe stack, the same concepts may be applied to other interconnect stacks. In one embodiment, protocol stack 200 is a PCIe protocol stack including transaction layer 205, link layer 210, and physical layer 220. An interface, such as interfaces 117, 118, 121, 122, 126, and 131 in FIG. 1, may be represented as communication protocol stack 200. Representation as a communication protocol stack may also be referred to as a module or interface implementing/including a protocol stack.

PCI Express uses packets to communicate information between components. Packets are formed in the Transaction Layer 205 and Data Link Layer 210 to carry the information from the transmitting component to the receiving component. As the transmitted packets flow through the other layers, they are extended with additional information necessary to handle packets at those layers. At the receiving side the reverse process occurs and packets get transformed from their Physical Layer 220 representation to the Data Link Layer 210 representation and finally (for Transaction Layer Packets) to the form that can be processed by the Transaction Layer 205 of the receiving device.

Transaction Layer

In one embodiment, transaction layer 205 is to provide an interface between a device's processing core and the interconnect architecture, such as data link layer 210 and physical layer 220. In this regard, a primary responsibility of the transaction layer 205 is the assembly and disassembly of packets (i.e., transaction layer packets, or TLPs). The translation layer 205 typically manages credit-base flow control for TLPs. PCIe implements split transactions, i.e. transactions with request and response separated by time, allowing a link to carry other traffic while the target device gathers data for the response.

In addition PCIe utilizes credit-based flow control. In this scheme, a device advertises an initial amount of credit for each of the receive buffers in Transaction Layer 205. An external device at the opposite end of the link, such as controller hub 115 in FIG. 1, counts the number of credits consumed by each TLP. A transaction may be transmitted if the transaction does not exceed a credit limit. Upon receiving a response an amount of credit is restored. An advantage of a credit scheme is that the latency of credit return does not affect performance, provided that the credit limit is not encountered.

In one embodiment, four transaction address spaces include a configuration address space, a memory address space, an input/output address space, and a message address space. Memory space transactions include one or more of read requests and write requests to transfer data to/from a memory-mapped location. In one embodiment, memory space transactions are capable of using two different address formats, e.g., a short address format, such as a 32-bit address, or a long address format, such as 64-bit address. Configuration space transactions are used to access configuration space of the PCIe devices. Transactions to the configuration space include read requests and write requests. Message space transactions (or, simply messages) are defined to support in-band communication between PCIe agents.

Therefore, in one embodiment, transaction layer 205 assembles packet header/payload 206. Format for current packet headers/payloads may be found in the PCIe specification at the PCIe specification website.

Figure 3:
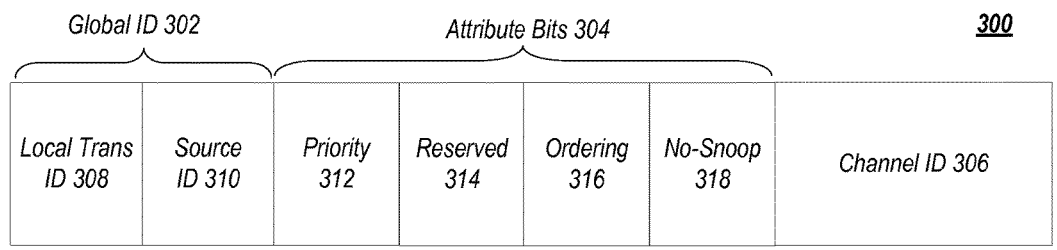
FIG. 3 illustrates an embodiment of a request or packet to be generated or received within an interconnect architecture.

Quickly referring to FIG. 3, an embodiment of a PCIe transaction descriptor is illustrated. In one embodiment, transaction descriptor 300 is a mechanism for carrying transaction information. In this regard, transaction descriptor 300 supports identification of transactions in a system. Other potential uses include tracking modifications of default transaction ordering and association of transaction with channels.

Transaction descriptor 300 includes global identifier field 302, attributes field 304 and channel identifier field 306. In the illustrated example, global identifier field 302 is depicted comprising local transaction identifier field 308 and source identifier field 310. In one embodiment, global transaction identifier 302 is unique for all outstanding requests.

According to one implementation, local transaction identifier field 308 is a field generated by a requesting agent, and it is unique for all outstanding requests that require a completion for that requesting agent. Furthermore, in this example, source identifier 310 uniquely identifies the requestor agent within a PCIe hierarchy. Accordingly, together with source ID 310, local transaction identifier 308 field provides global identification of a transaction within a hierarchy domain.

Attributes field 304 specifies characteristics and relationships of the transaction. In this regard, attributes field 304 is potentially used to provide additional information that allows modification of the default handling of transactions. In one embodiment, attributes field 304 includes priority field 312, reserved field 314, ordering field 316, and no-snoop field 318. Here, priority sub-field 312 may be modified by an initiator to assign a priority to the transaction. Reserved attribute field 314 is left reserved for future, or vendor-defined usage. Possible usage models using priority or security attributes may be implemented using the reserved attribute field.

In this example, ordering attribute field 316 is used to supply optional information conveying the type of ordering that may modify default ordering rules. According to one example implementation, an ordering attribute of "0" denotes default ordering rules are to apply, wherein an ordering attribute of "1" denotes relaxed ordering, wherein writes can pass writes in the same direction, and read completions can pass writes in the same direction. Snoop attribute field 318 is utilized to determine if transactions are snooped. As shown, channel ID Field 306 identifies a channel that a transaction is associated with.

Link Layer

Link layer 210, also referred to as data link layer 210, acts as an intermediate stage between transaction layer 205 and the physical layer 220. In one embodiment, a responsibility of the data link layer 210 is providing a reliable mechanism for exchanging Transaction Layer Packets (TLPs) between two components a link. One side of the Data Link Layer 210 accepts TLPs assembled by the Transaction Layer 205, applies packet sequence identifier 211, i.e. an identification number or packet number, calculates and applies an error detection code, i.e. CRC 212, and submits the modified TLPs to the Physical Layer 220 for transmission across a physical to an external device.

Physical Layer

In one embodiment, physical layer 220 includes logical sub block 221 and electrical sub-block 222 to physically transmit a packet to an external device. Here, logical sub-block 221 is responsible for the "digital" functions of Physical Layer 221. In this regard, the logical sub-block includes a transmit section to prepare outgoing information for transmission by physical sub-block 222, and a receiver section to identify and prepare received information before passing it to the Link Layer 210.

Physical block 222 includes a transmitter and a receiver. The transmitter is supplied by logical sub-block 221 with symbols, which the transmitter serializes and transmits onto to an external device. The receiver is supplied with serialized symbols from an external device and transforms the received signals into a bit-stream. The bit-stream is de-serialized and supplied to logical sub-block 221. In one embodiment, an 8b/10b transmission code is employed, where ten-bit symbols are transmitted/received. Here, special symbols are used to frame a packet with frames 223. In addition, in one example, the receiver also provides a symbol clock recovered from the incoming serial stream.

As stated above, although transaction layer 205, link layer 210, and physical layer 220 are discussed in reference to a specific embodiment of a PCIe protocol stack, a layered protocol stack is not so limited. In fact, any layered protocol may be included/implemented. As an example, an port/interface that is represented as a layered protocol includes: (1) a first layer to assemble packets, i.e. a transaction layer; a second layer to sequence packets, i.e. a link layer; and a third layer to transmit the packets, i.e. a physical layer. As a specific example, a common standard interface (CSI) layered protocol is utilized.

Figure 4:
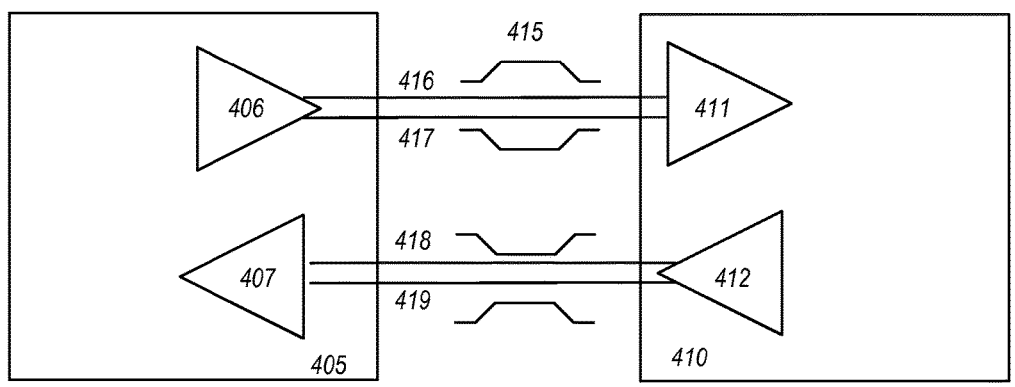
FIG. 4 illustrates an embodiment of a transmitter and receiver pair for an interconnect architecture.

Referring next to FIG. 4, an embodiment of a PCIe serial point to point fabric is illustrated. Although an embodiment of a PCIe serial point-to-point link is illustrated, a serial point-to-point link is not so limited, as it includes any transmission path for transmitting serial data. In the embodiment shown, a basic PCIe link includes two, low-voltage, differentially driven signal pairs: a transmit pair 406/411 and a receive pair 412/407. Accordingly, device 405 includes transmission logic 406 to transmit data to device 410 and receiving logic 407 to receive data from device 410. In other words, two transmitting paths, i.e. paths 416 and 417, and two receiving paths, i.e. paths 418 and 419, are included in a PCIe link.

A transmission path refers to any path for transmitting data, such as a transmission line, a copper line, an optical line, a wireless communication channel, an infrared communication link, or other communication path. A connection between two devices, such as device 405 and device 410, is referred to as a link, such as link 415. A link may support one lane—each lane representing a set of differential signal pairs (one pair for transmission, one pair for reception). To scale bandwidth, a link may aggregate multiple lanes denoted by xN, where N is any supported Link width, such as 1, 2, 4, 8, 12, 16, 32, 64, or wider.

A differential pair refers to two transmission paths, such as lines 416 and 417, to transmit differential signals. As an example, when line 416 toggles from a low voltage level to a high voltage level, i.e. a rising edge, line 417 drives from a high logic level to a low logic level, i.e. a falling edge. Differential signals potentially demonstrate better electrical characteristics, such as better signal integrity, i.e. cross-coupling, voltage overshoot/undershoot, ringing, etc. This allows for better timing window, which enables faster transmission frequencies.

In some implementations, a link, such as a PCIe-compliant link, can include one or more retimers or other extension devices, such as a repeater. A retimer device (or simply "retimer"), can include active electronic devices that receive and re-transmit (retime) digital I/O signals. Re-timers can be used to extend the length of a channel that can be used with a digital I/O bus. Retimers can be protocol aware, software transparent, and capable of executing a link equalization procedure, such as the link equalization procedure of PCIe. A link incorporating one or more retimers can form two or more separate electrical sub-links at data rates comparable to data rates realized by links employing similar protocols but with no retimers. For instance, a link including a single retimer can form a link with two separate sub-links, each operating at 8.0 GT/s or higher.

Other extension devices exist, however, some of these possess interoperability issues with some communication protocols. As an example, some repeaters may not support the link equalization protocol of PCIe 3.0. Further, some applications tend to utilize channels of longer physical lengths that make use of extension devices to realize such channel lengths. These and other trends have made retimers increasingly important devices in many systems.

Figures 5A, 5B:
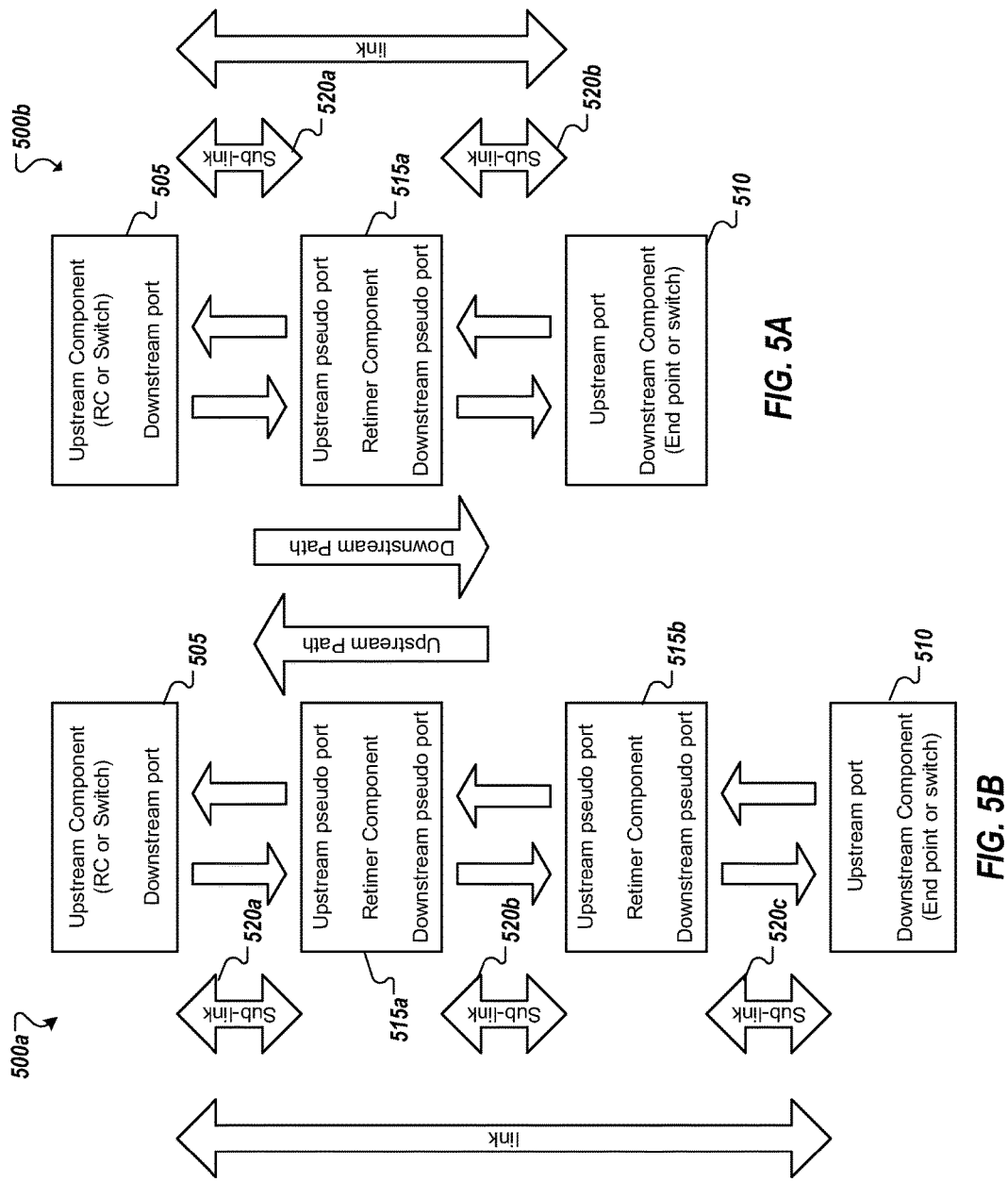
FIGS. 5A-5B illustrate simplified block diagrams of example links including one or more extension devices.

FIGS. 5A-5B illustrate simplified block diagrams 500a-b of example links including one or more retimers. For instance, in FIG. 5A, a link connecting a first component 505 (e.g., an upstream component) to a second component 510 (e.g., a downstream component) can include a single retimer 515a. A first sublink 520a can connect the first component 505 to the retimer 515a and a second sublink 520b can connect the retimer 515a to the second component. As shown in FIG. 5B, multiple retimers 515a, 515b can be utilized to extend a link. Three sublinks 520a-c can be defined through the two retimers 515a, 515b, with a first sublink 515a connecting the first component to the first retimer 515a, a second sublink connecting the first retimer 515a to the second retimer 515b, and the third sublink 515c connecting the second retimer 515b to the second component.

As shown in the examples of FIGS. 5A-5B, a retimer can include two pseudo ports, and the pseudo ports can determine their respective downstream/upstream orientation dynamically. Each retimer 515a, 515b can have an upstream path and a downstream path. Further, retimers 515a, 515b can support operating modes including a forwarding mode and an executing mode. A retimer 515a, 515b in some instances can decode data received on the sublink and re-encode the data that it is to forward downstream on its other sublink. In some cases, the retimer can modify some values in the data it receives, such as when processing and forwarding ordered set data. Additionally, a retimer can potentially support any width option as its maximum width, such as a set of width options defined by a specification such as PCIe.

In some instances, faults can emerge on a channel. When utilizing one or more retimers, a link includes multiple sublinks and a fault on any one of the sublinks can result in a fault being detected for the entire link. A test mode can be provided that allows in-system fault location to be determined at the sublink level such that the specific sublink fault is identified in a link including one or more retimers. The identification of the affected sublink can be used in a debug procedure performed for the link.

Figure 6C:
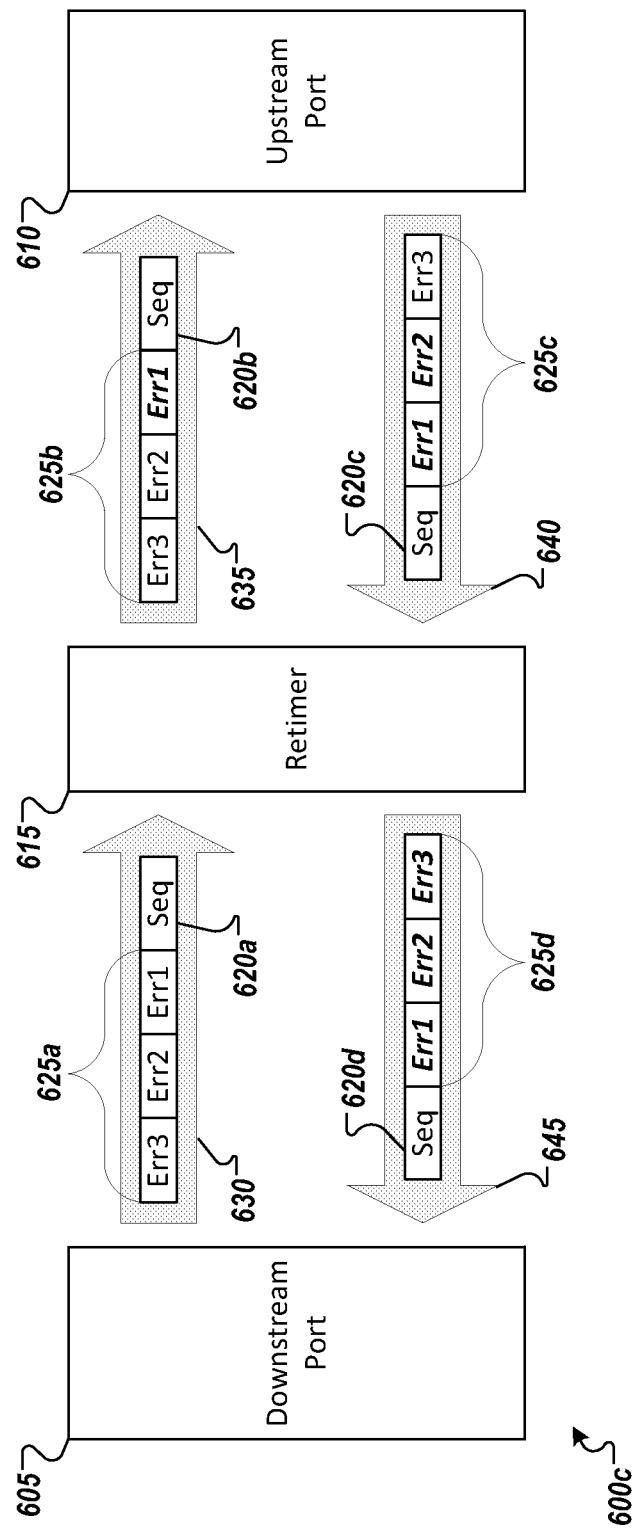

FIGS. 6A-6E illustrate example block diagrams 600a-e showing example implementations of a test mode for determining which of the electrical sublinks in a channel are producing errors in the channel. In the example of FIG. 6A, the test mode can be entered and the test mode can define a standardized signal that is to be sent across a channel between an downstream port 605 (e.g., of a first endpoint) and an upstream port 610 (e.g., of another endpoint) and over a retimer 615. A first endpoint (e.g., 605) (such as a root port) can send a signal that includes a defined sequence 620a of data followed by an error reporting sequence 625a. The retimer 615 receives the signal 630 and determines whether the sequence 620a matches the sequence that is expected. If the sequence 625a does not match the sequence defined for the test mode, the retimer 615 is to identify the deviation as an error.

After receiving signal 630, retimer 615 can, in turn, generate a further signal 635 in connection with the test mode. In one implementation, in signal 635, the retimer 615 is to reproduce the same defined sequence (at 620b). The retimer 615 does not reproduce the sequence 620a as received in the signal 630, but regenerates the sequence afresh (e.g., 620b) as defined for the test mode. This can serve to isolate sublink faults, such that a sequence containing errors is not propagated across the channel, making it difficult to identify where (e.g., which sublink) is the source of the error. Information encoded in the error reporting sequence (e.g., 625a, 625b), however, is to be maintained in each signal sent in the test mode, such that error detection results are passed on from device to device within the test mode. Further, the error detection information encoded in each error reporting sequence (e.g., 625a, 625b) is to be updated as further errors are detected within sublinks of the channel. For instance, the retimer 615, upon receiving and analyzing sequence 620a for errors, can encode at least a portion of the error reporting sequence 625b to identify whether one or more errors were detected at the retimer 615 for a sublink connecting endpoint 605 and retimer 615. This information can be in addition to other information described in the previously received error reporting sequence 625a.

Continuing with the example of FIG. 6A, the retimer 615 can send signal 635 that includes the updated error reporting sequence 625b and the freshly generated sequence 620b. A second endpoint 610 can receive the signal 635 and analyze sequence 620b for discrepancies (e.g., one or more incorrect bits deviating from the defined sequence for the test mode), identifying an error or fault condition on the sublink between retimer 615 and endpoint 610 based on any identified discrepancies. The second endpoint can further decode error reporting sequence 625b to identify which (if any) of the sublinks in the channel produced an error during the test. Errors can, in some cases, be recorded in one or more registers for later processing and analysis by link testing and management tools, among other examples.

Turning to the example of FIG. 6B, in some implementations, a loopback state can be leveraged to implement a test mode. In some instances, using a loopback test mode can assist in overcoming potential backward compatibility issues. In many instances, the endpoints and/or retimers on a channel may be provided by different manufacturers, vendors, etc. One or more of the endpoint devices may not possess logic to support the test mode (e.g., detect errors in a test sequence, update error reporting sequence data, update sublink error registers, etc.) while nonetheless supporting a loopback mode, such as a loopback mode defined according to an interconnect protocol utilized by devices in the channel (e.g., PCIe). A particular endpoint that does not support the test mode can pass back error reporting sequence data generated by and received from upstream components (e.g., the other endpoint and the retimers), allowing one or more of these components to observe and process the results of the test mode, despite the particular endpoint not fully supporting the test mode, among other example implementations.

In FIG. 6B, signals 630 and 635 are sent from a first endpoint 605 to a retimer 615 and from the retimer 615 to the second endpoint 610 respectively, for instance, as in the example of FIG. 6A. The test mode can be implemented in a loopback state such that when signal 635 reaches the second endpoint 610 the signal is loopbacked through a signal 640 sent from the second endpoint 610 to retimer 615. The signal 640 can include the regeneration of sequence 620c and an error reporting sequence 625c that includes error detection information from the analyses of sequences 620a and 620b in signal. Retimer 615 can analyze sequence 620c for errors. The error status of the sublink between endpoint 610 and retimer 615, as detected by the retimer 615 from the received sequence 620c, can be communicated in updated error reporting sequence 625d included in signal 645 that further includes another instance of sequence 620d, as generated and sent by retimer 615 to endpoint 605.

In the example of FIG. 6B, endpoint 605 can perform a final error analysis in the test loopback by analyzing the sequence 620d received in test mode signal 645. Further, endpoint 605 can interpret error reporting sequence 625d to identify the results of analyses of sequences 620a, 620b, 620c, 620d during the loopback. Error conditions in the specific sublinks between endpoints 605 and 610 and retimer 615 can be identified from the information included in error reporting sequence 625d. Additional logic in endpoint 605 (and potentially also (or alternatively) in endpoint 610 or retimer 615) can report the sublink error status to a register (e.g., corresponding to the channel) or another data structure or logic for use in link analysis and debugging, among other examples.

Turning to FIG. 6C, in some implementations, error reporting sequences (e.g., 625a-d) can include a series of error reporting data sets (or "segments"), where each error reporting segment corresponds to at least one of the sublinks in a channel including one or more retimers (e.g., 615) and connecting two endpoints 605, 610. For instance, in the example of FIG. 6B, error conditions are reported three times (e.g., at 625b, 625c, 625d summarizing analysis of sequences 620a, 620b, 620c). Accordingly, at least three segments can be provided in each of error reporting sequences 625a-b. For instance, as illustrated in the example of FIG. 6C, the results of the analysis of sequence 620a can be reflected by encoding the results in segment "Err1" included in error reporting sequence 625b. The encoding of error reporting segment Err1 (by retimer 615), and the error status information described through the encoding, can be effectively passed through by endpoint 610 in error reporting sequence 625c. For instance, endpoint 610 can re-encode Err1 of error reporting sequence 625c with the same encoding included in Err1 of error reporting sequence 625b. Further, endpoint 610 can identify that the results of its analysis (e.g., of received sequence 620b) are to be encoded in another of the segments of error reporting sequence, in this example "Err2" in error reporting sequence 625c. Likewise, the next error reporting sequence 625d (e.g., generated by retimer 615) can include the same encodings of Err1 and Err2 as included in error reporting sequence 625c to propagate the reported analysis results to endpoint 605 along with the results of the analysis of sequence 620c performed by retimer 615 and described in the retimer's encoding of a corresponding error reporting segment "Err3", among other examples.

Error reporting sequences or other error reporting data, can be formatted and encoded in a variety of ways to progressively document the error status of sublinks of a channel during a test mode. As introduced in the example of FIG. 6C, in some implementations, error reporting data can be segmented, with each segment designated to describe error status information of a particular sublink of the channel. In some implementations, error reporting sequences can be preconfigured based on the structure of the links they are to describe. For instance, if a loopback test mode is to be provided for a link employing two retimers (and thus three sublinks in each direction), at least five error reporting segments can be defined. On the other hand, for a link employing a single retimer (and two sublinks), an error reporting sequence can be defined to include at least three segments for testing the link, and so on. In some cases, a common error reporting sequence can be defined that includes a number of segments that corresponds to a maximum number of sublinks supported for the test mode. In still other examples, segmentation and structure of error reporting sequences can be determined dynamically, for instance, by analyzing the link for a number of extension devices and sublinks, among other examples.

As illustrated in some of the previous examples, an error reporting sequence, in some instances, can be implemented as a sequence of segments, each of the segments corresponding to error detection for a respective sublink in a channel. Further, separate segments can be statically assigned to an upstream portion of the channel associated with the sublink and the downstream portion of the channel associated with the same sublink. In other instances, error reporting sequence segments can be dynamically mapped or assigned to sublink error reporting results. For instance, segments can be assigned on a first-come basis, with the error report results of a first assessment occupying the first segment, results of a second assessment occupying the second segment, and so on. In some implementations, a test mode can be used in both directions of the link such that in some cases, the test mode sequence (e.g., 620) is first sent upstream on the link and in other cases first sent downstream on the same link. In such cases, error assessment of the first sublink may be the first one to be reported in some tests (e.g., and reported in the Err1 segment), and in other cases assessment of another sublink may instead be reported first (e.g., in the Err1 segment), among other potential examples.

Figure 6D:
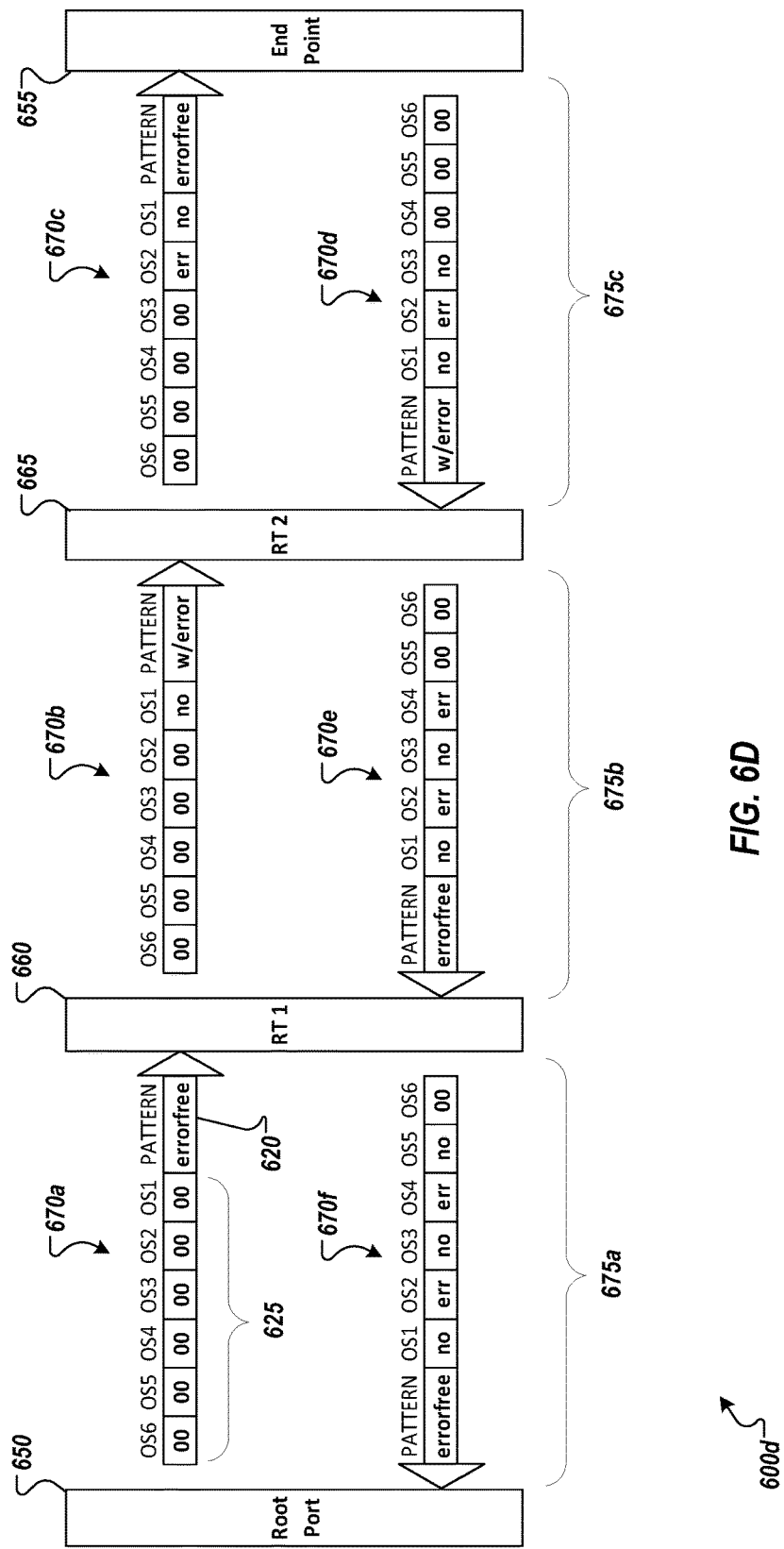
Figure 6E:
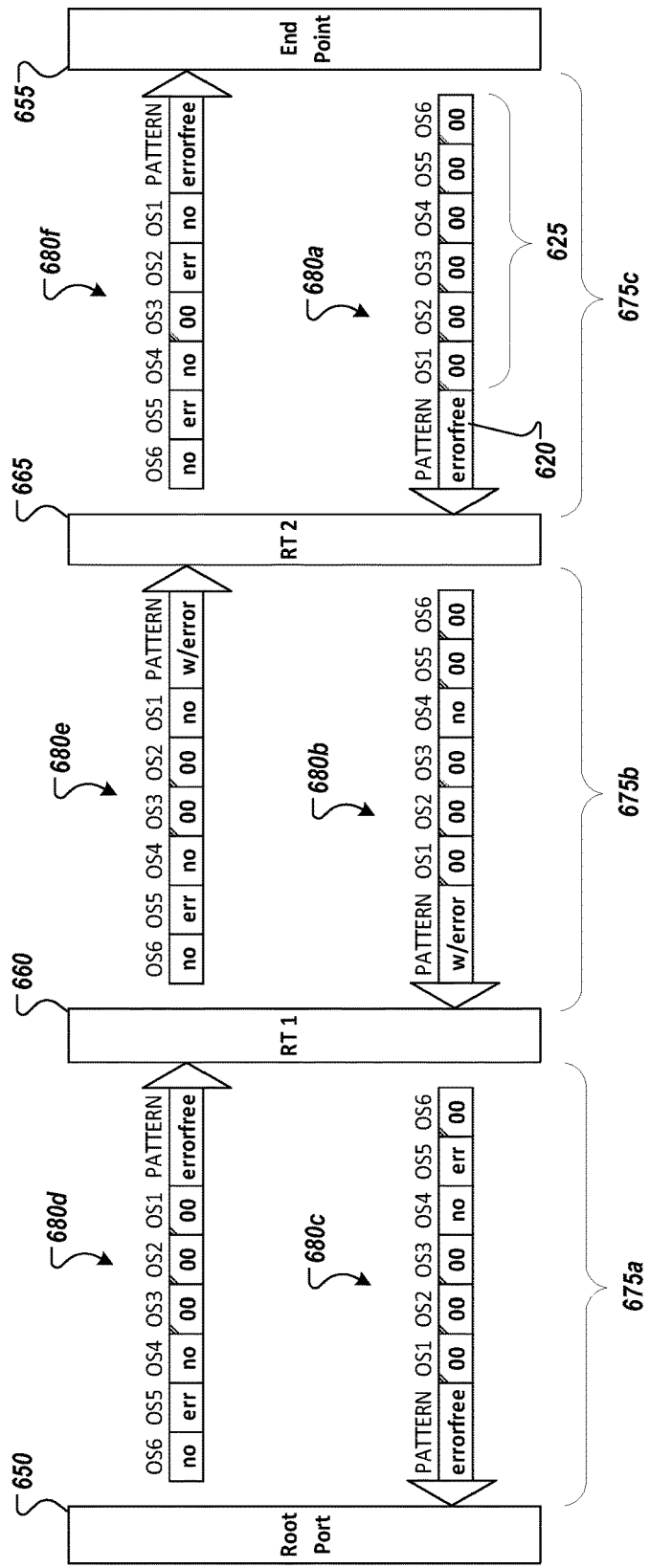

In some implementations, an ordered set, training sequence, or other defined data sequence of an existing protocol, such as PCIe, PCI, QPI, etc., can be leveraged for use in a test mode. For instance, the fixed test mode sequence (e.g., 620) communicated across each sublink can be defined to include a defined sequence of an interconnect protocol. For example, in some implementations, a PCIe electrical idle ordered set (EIOS), electrical idle exit sequence ordered set (EIEOS), modified compliance pattern, or other pattern or ordered set can be used as or included in the fixed test mode sequence. In some instances, defined ordered sets or other sequences can be modified or enhanced for use in or as the error reporting data (e.g., 625). Leveraging a defined, existing ordered set or other sequence for error reporting can assist with achieving high inter-operability, allowing legacy devices, in some instances, to accept and validate the signals even when the device lacks logic for interpreting, with precision, the particular error encodings included in the established ordered set. For example, in one implementation, PCIe SKP ordered sets (SKP OSes) or another ordered set can be used. For instance, as shown in the examples of FIGS. 6D and 6E, a sequence of ordered sets (e.g., OS1-OS6) can be utilized as the segments in an example error reporting sequence (e.g., 625). Each ordered set can provide for one or more fields, symbols, bytes, etc. in which error assessment results can be encoded.

In the example of FIG. 6D, an example link connects a root port 650 to a particular end point 655 and includes two retimers 660, 665. Three sublinks 675a, 675b, 675c can connect the root port 650 to the first retimer 660, the first retimer 660 to the second retimer 665, and the second retimer 665 to the endpoint device 655. In the example of FIGS. 6D and 6E, a register can include data defining which of the ordered sets (e.g., OS1-OS6) correspond to which sublink channel within a test mode. The fixed test mode sequence/pattern (e.g., 620) to be included in each test mode signal (e.g., 670a-670f) can also be pre-assigned such that when a test mode is entered, each device (e.g., 650, 655, 660, 665) on the link is configured to assess whether the pattern 620 has been successfully transmitted over each sublink channel. As in previous examples, if the received pattern deviates from the expected pattern, the receiving/assessing device can encode the error reporting segment (e.g., OS1-OS6) corresponding to that sublink with information describing the error. Such information can include, for instance, the number of errors detected in the pattern received over the sublink, the block and/or bit where the first of the errors was detected, the lane of the sublink where the error was detected, among other examples. This ordered set containing the error report can be forwarded by subsequent devices on the link to preserve the error assessment results of the particular sublink as provided by the device on the receiving end of the particular sublink.

As an illustration, in the example of FIG. 6D, a first signal 670a is sent including test mode pattern 620 and segments of an error reporting sequence 625 in connection with a test mode implemented using a loopback state of the system. As the initial signal 670a is sent before any error has been assessed, the portions of the segments (e.g., OS1-OS6) of an error reporting sequence 625 to be encoded with error results can be sent empty (or encoded to indicate that an error report of each sublink channel has yet to be completed). A first retimer 660 can receive signal 670a and assess whether the test mode pattern deviates from what is expected. In this example, the test mode pattern 620 is sent error free over the downstream channel of the first sublink 675a. The retimer 660 can identify that a first ordered set OS1 is to be used to document errors for the downstream channel of the first sublink 675a and accordingly encode the error reporting sequence segment OS1 to indicate that no errors were detected on the downstream channel of the first sublink 675a. The loopback test mode can continue with retimer 660 regenerating the test mode pattern and including it in signal 670b along with error reporting sequence data that includes the encoded results of the assessment of the first sublink 675a in OS1 (e.g., showing "no" errors).

As shown in the example of FIG. 6D, in the case of signal 670b the pattern as received by the second retimer 665 includes an error. The error can be evidenced by one or more bits of the received pattern deviating from the expected value of the pattern. Such errors can be caused by a variety of potential faults on the sublink, including the transmitting device (e.g., 660), the receiving device (e.g., 665), or lanes of the sublink itself (e.g., 675b). Accordingly, in this example, the second retimer 665, when generating and sending the following test mode signal 670c can identify that error results for the downstream channel of the second sublink 675b are to be encoded in ordered set OS2 of the error reporting sequence included in signal 670c. Accordingly, the second retimer 665 can encode OS2 in signal 670c to describe the errors detected for the downstream channel of the second sublink 675b. Further, the retimer 665 can ensure that the encoding of ordered set OS1 is reencoded/repeated in the error reporting sequence of signal 670c to include the same encoding as received in OS1 of test mode signal 670b. The test mode signal 670c can then be sent to the endpoint 655 over the downstream channel of sublink 675c and endpoint 655 can assess the fixed test mode pattern included in signal 670c to identify that the patter is received error free over the downstream channel of sublink 675c.

Continuing with the previous example, subsequent test mode signals (e.g., 670d-670e) can be sent in accordance with a loopback of the test mode signal sequence over upstream channels of sublinks 675c, 675b, 675a. In this example, the only other errors that are identified are in the pattern of test mode signal 670d sent on the upstream channel of sublink 675c. Accordingly, subsequent test mode signals (e.g., 670e, 670f) can reflect the earlier detection of this error in the error reporting segment (e.g., OS4) corresponding to the downstream channel of the third sublink 675c.

Upon receiving the loopbacked test mode sequence (at signal 670f) the root port, or another component, can identify the error information documented in the error reporting sequence segments OS1-OS6 to identify, on a sublink-by-sublink basis, where and what errors occurred. In one example implementation, one or more control status registers can be maintained for the devices (e.g., 650, 655, 660, 665), sublinks (e.g., 675a-675c), and/or sublink channels, as well as (or alternatively) for the link as a whole. Error information included in the error reporting sequence segments OS1-OS6 can be used to populate the registers with error information. The error information in these registers can be tracked to perform assessments of the sublinks and the devices attached to each sublink to identify fault conditions or other issues on the link.

In one example implementation, one or more control status registers can be defined. A link capabilities register can be provided that includes one or more bits to identify whether the loopback test mode is supported for a sublink channel (or device on a sublink) and one or more bits can further identify what level of error detection capabilities are available at the channel (e.g., block-level, bit-level, lane-level error detection, etc.). A link control register can be provided that includes fields that can be set to indicate when a test mode has been entered and how a particular device is to function (e.g., regenerate a particular fixed test mode sequence followed by a particular number of error reporting segments, etc.) during the test mode. An error log register can also be provided that is used in connection with error reporting sequence data generated during a test. The error log register, in one example, can include such fields as:

TABLE 1

| Field | Description |
|---|---|
| LFSR Seed [22:0] | LFSR value in Lane 0 at the start of Data Block (after SKP OS or SDS) where first error occurred |
| First Error Location[16:0] | {Block No[8:0], Bit No[7:0]} where first error was detected |
| First Error Lane[3:0] | Lane ID where the first error occurred |
| First Error SubLink[3:0] | Sublink ID where the first error occurred |
| Error SubLink[5:0] | Sublinks that have been identified as having an error |
| Lane_Error_Status[15:0] | A register used to track further error following the first error |

In some implementations, a loopback test mode (or test mode) can be supported in both directions of a link including one or more retimers (or other extension devices). For instance, as shown in the example of FIG. 6E, a loopback test mode can alternatively begin at endpoint 655 and be looped back at root port 650 to the endpoint 655. For instance, endpoint 655 can send a first signal 680a in the test that includes the test mode pattern 620 and an error reporting sequence that includes six ordered set segments (e.g., OS1-OS6). In this example, the error reporting segments OS1-OS6 can maintain the same sublink channel assignments as in the example of FIG. 6D. For instance, retimer 665 can report the error assessment performed on the pattern of the first signal 680a in the loopback by encoding the error reporting segment assigned to the upstream channel of sublink 675c (e.g., OS4) and sending signal 680b including the encoded segment. Next, retimer 660 receives the signal 680b and assesses whether the pattern includes errors. The retimer 660 encodes its test results in the error reporting segment (e.g., OS5) assigned to the upstream channel of sublink 675b, and adds the encoded error reporting segment to the error reporting sequence included in test mode signal 680c. As in the example of FIG. 6D, this test sequence continues with the testing of (and reporting results for) the remaining sublink channels using signals 680d-680f. The results of the test can be ultimately passed to endpoint 655 through signal 680f. Further, as in the example of FIG. 6D, the final sublink test can be performed at the device receiving the final test mode signal (e.g., 670f, 680f), although the results of this test may not be included in any of the test mode signals. Accordingly, in some instances, the error reporting segment assigned to the last sublink channel to be tested may remain empty (as the results are obtained directly by the device (e.g., 650, 655) performing the test on the final test mode signal (e.g., 670f, 680f)) in the test mode sequence. In some instances, unused error reporting segments can be encoded for purposes other than error reporting, such as to maintain DC balance across the series of error reporting segments, among other example uses.

As seen in the examples of FIGS. 6D and 6E, in some implementations, each upstream and downstream channel of the sublinks to be tested (e.g., 675a-c) can be assigned a respective error reporting sequence segment (e.g., OS1-OS6), resulting (in the case illustrated in FIGS. 6D and 6E) in an error reporting sequence that includes six segments. In some implementations, each sublink can be assigned multiple error reporting sequence segments, further extending the length of test mode signals. For instance, each sublink channel can each be assigned two or more error reporting segments (e.g., to accommodate the encoding of more detailed error status information in connection with the test of each sublink channel).

Alternative embodiments, rather than statically assigning sublink channels to particular ordered sets in the error reporting sequence, can instead provide a set of segments that can be assigned or used at the invocation of the test mode, according to the parameters of the test. For instance, in one example, the error reporting segments provided in the test mode signals can be used in according to the order in which sublink channels are tested. For instance, whatever sublink is the first to be tested during the loopback test mode would have its results encoded in a segment designated for the first-performed test results (e.g., OS1). For example, using such an approach in the example of FIG. 6E, error assessment results for the first test mode pattern in signal 680a would be encoded in OS1, the second error assessment of signal 680b would be encoded in OS2, and so on. However, when the loopback test mode is run beginning with a test of sublink 675a, as in the example of FIG. 6D, the test results for the pattern in sequence 670a would be encoded in OS1, the test results for the pattern in sequence 670b would be encoded in OS2, and so on. In such an alternative implementation, the error reporting sequence, rather than providing dedicated error reporting segments for each sublink channel, may provide error reporting segments according to the number of reported test results that are to be generated (e.g., using five instead of six segments to support a link with two extension devices), among other potential examples.

In one illustrative example, a test mode can be provided in a PCIe-compliant system and can be entered by performing an entry into PCIe Loopback. In some implementations a control signal can be sent to bring the link (including one or more extension devices) into loopback and further indicate that the loopback is a test mode loopback. In other instances, one or more bits of training sequences and/or framing tokens can be used to negotiate entry into the test mode loopback state. In some instances, one or more bits of the training sequences used to transition to the loopback state can include one or more bits encoded to indicate that the loopback state is a test mode loopback state, such as one implementing the principles of the example test modes described herein. Further, in one example, the test mode loopback signaling can begin with the sending of an EIEOS followed by a start of data stream (SDS) ordered set indicating a Loopback.Active state. The EIEOS-SDS sequence, in one example, can serve as the fixed test mode pattern that is to be assessed for each sublink. The test mode can be defined such that the only patterns that allowed in the data block are data_in=0 (e.g., the standard LFSR output) and a sequence of SKP OSes embodying segments of the error reporting sequence to be included in each test mode signal sent from sublink to sublink In an embodiment defining a series of six consecutive SKP OSes, the sequence of SKP OSes can be sent at exactly the 370 block interval. Each device on the link can be aware of and expect the test mode signals to proceed accordingly (with the exception of some devices not equipped with logic to decode error reporting information encoded in the SKP OS variants used in the test mode signals). Architectures can support different clocking architectures and some of them require SKP OS to be transmitted at different nominal rates. For instance, in the case of a Separate Reference Clocks with Independent Spread Spectrum Clocking (SSC) (SRIS) architecture, the six SKP OSes may be scheduled after 37 Data Blocks.

FIG. 7 illustrates a representation of an example PCIe SKP ordered set 700, augmented to support the loopback test mode described above. For instance, symbols 0 through (4*N−1) can correspond to the standard SKP symbol. Symbol 4*N can be the standard SKP_END symbol alerting that the only three more symbols are included in the present SKP OS. The last three symbols 705, 710, 715 can be reserved to be encoded with information corresponding to a particular use case of the SKP OS. In some cases, the standard SKP symbols preceding SKP symbols 705, 710, 715 can also be tested (along with the test mode pattern) for errors. These standard SKP symbols can be considered part of the test mode pattern, in such instances. In some cases, the proper format of symbols 705, 710, 715 (e.g., 4*N+1, 4*N+2, 4*N+3) can be based on the link training state (LTSSM) of the link In one example, SKP symbols 705, 710, 715 can be defined to be encoded for reporting sublink test results when the link state is Loopback. In one example, the 24 bits of data included in SKP symbols 705, 710, 715 can implement an error reporting segment for a sublink and can be adapted for encoding error reporting results according to the following format:

TABLE 2

| | |
|---|---|
| Bit [0] | Set to 1b to indicate that the sublink "owns" that SKP |
| Bits[9:1] | Block Number where the first error occurred: all 1's indicate no error. The block number can be counted from the ordered set after the SDS or the last SKP OS that the sublink claimed |
| Bits[17:10] | Bit number where the first error occurred: no error is 8'h03 |

TABLE 2-continued

| | |
|---|---|
| Bits[21:18] | Total number of bit errors (error count) (>0 if bit[1] = 1b, a value of 15 indicates >=15 errors have been received in this sequence) |
| Bit[22] | 1b if the sublink has lost block alignment |
| Bit[23] | Even parity bit (e.g., XOR of bits [22:0]) |

It should be appreciated that the implementations described above are provided as non-limiting examples presented merely to conveniently illustrate some of the features disclosed herein. For instance, a test mode can be provided that is compliant with an interconnect protocol other than PCIe (e.g., QPI, IDI, PCI, etc.) and that leverages some of the features (e.g., ordered sets, training sequences, link states, etc.) defined in the protocol. Further, while retimers are often named in the examples above, it should be appreciated that some of the principles and features described herein are just as applicable to systems employing other types of extension devices. Additionally, other test mode signals, fixed test mode patterns, and error reporting sequences, among other example alternatives, can be implemented beyond the specific examples named herein without departing from the scope of the concepts disclosed in the present Specification.

In-Band Disconnect Detection

Retimers and other extension devices can be used in a variety of different system employing a variety of different features and form factors. For instance, some systems can provide for hot-plugging of devices on a link including one or more retimers. In some instances, retimers can be used inside cables and such cables may be intended to support hot-plugging and other uses. In some cases, retimers can be implemented in some applications that do not provide for sideband signals and/or other supporting logic that provide out-of-band connect/disconnect signaling. Further, retimers can be poorly- or un-equipped to handle disconnects and reconnects on a link of which it is a part, limiting the use of such retimers. Accordingly, less robust extension devices (e.g., that are more tolerant of surprise disconnects/reconnects) are often substituted for retimers and other extension devices that might better comply with interconnect protocol features and requirements, and otherwise be a more optimal extension solution.

In some implementations, in-band disconnect/reconnect detection can be supported by an example retimer. Such solutions can address at least some of the issues introduced above, among other example advantages. A retimer equipped with in-band disconnect/reconnect detection logic can dynamically detect and support surprise disconnects and reconnects (such as in a hot-plug), among other features and uses. The detection of a disconnect (and/or reconnect) can be facilitiated through such logic through an analysis of signals received on the ports of the retimer. Accordingly, the retimer can infer a disconnect/reconnect sequence on the link from in-band data and without corresponding sideband signaling. Indeed, in some implementations, a retimer can forego support of such sideband signaling, relying entirely on in-band disconnect/reconnect detection. Further, implementing such in-band disconnect/reconnect detection logic can enable a variety of new use cases for retimers, including expanding the use of such retimers within particular interconnect protocols, such as PCIe.

Figure 8:
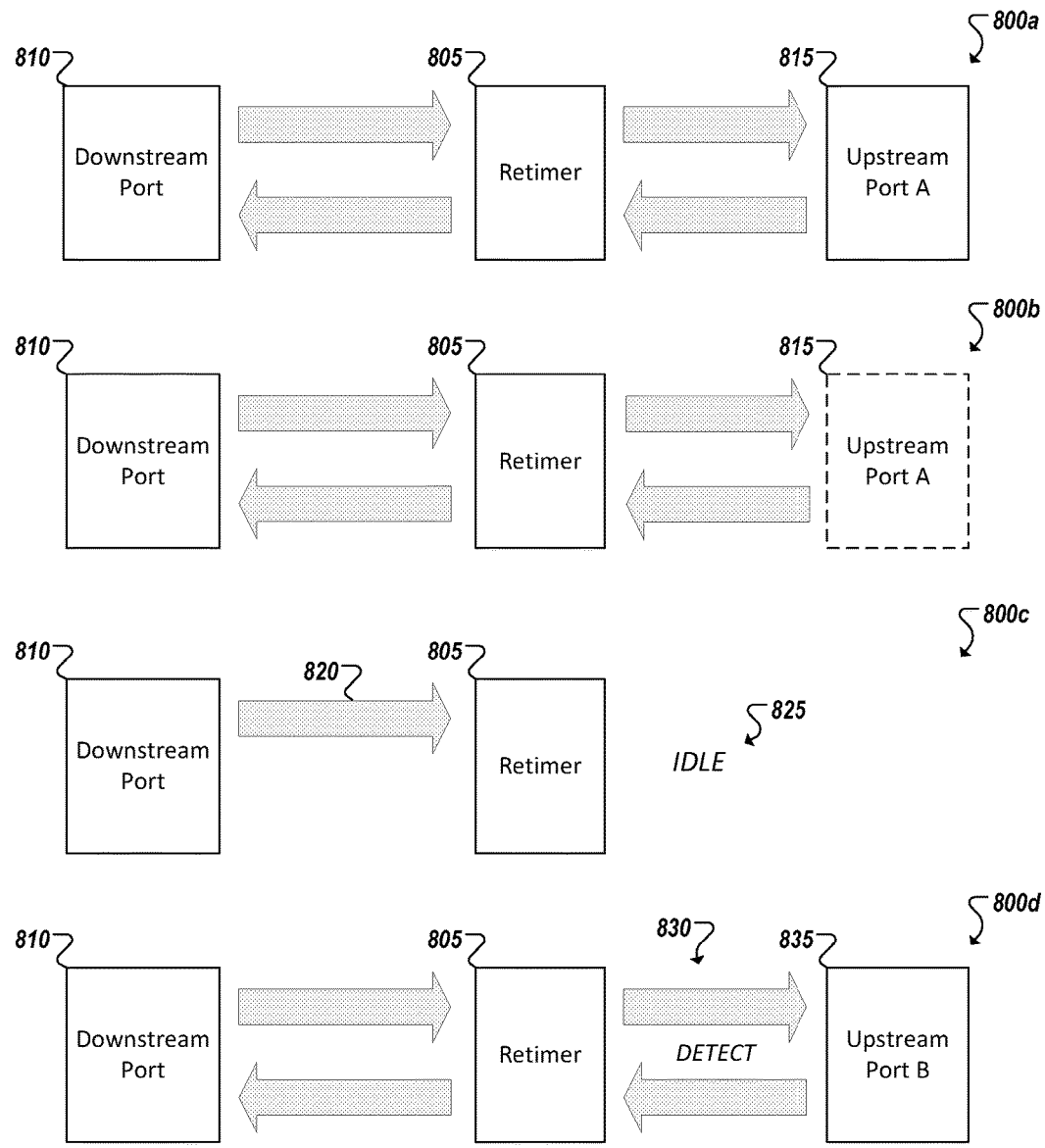
FIG. 8 illustrate simplified block diagrams representing an example disconnection and reconnection on a link.

Turning to the example of FIG. 8, a series of simplified block diagrams 800a-d are shown illustrating an example surprise disconnection and reconnection on a link including at least one retimer 805. In representation 800a, the link can connect a downstream port 810/9 e.g., of a first endpoint) and a first upstream port 815 (e.g., of a second endpoint). If a surprise disconnect of the second endpoint 815 occurs, as illustrated in representation 800b, the retimer may not have been warned or immediately recognize that the second endpoint 815 is no longer connected. Crosstalk and other ambient signals can appear on the downstream port of the retimer, despite the retimer 805 not being connected to any device on the port. The retimer 805 can nonetheless forward some of these meaningless signals onto the other endpoint 810 before inferring or detecting that an idle condition exists on the downstream port of the retimer 805. Further, the endpoint 810 may similarly detect an issue on the link (e.g., based on garbage signals forwarded to the endpoint 810 by the retimer following disconnection of the other endpoint 815) and begin link training to correct the issue. As shown in diagram 800c, link training data 820, such as training sets, predefined training sequences (e.g., including ordered sets and other similar data), and other data can be sent by the connected endpoint 610 to the retimer 805. In some cases, the link training data 820 can be sent in connection with an attempt to recover the link (e.g., initiated by the endpoint 810). Based on detecting both the idle condition (e.g., 825) on the downstream port together with link training data 820 on the upstream port of the retimer, the in-band disconnect/reconnect detection logic of the retimer can infer that a disconnect has taken place. Further, in response, the retimer can trigger a detect state 830 in which the retimer logic attempts to detect whether and when a new connection has been completed with another upstream port 835 (of another endpoint, such as a hot-plugged device). For instance, upon identifying the disconnection, the in-band disconnect/reconnect detection logic of the retimer can remove its connections (e.g., 50 ohm connections) and attempt to discover new terminations (e.g., 50 ohm terminations), as shown, for instance, in diagram 800d.

Multi-Mode Retimer

The use of extension devices, such as retimers, is sometimes constrained to particular types of applications and systems. For instance, many systems and applications cannot tolerate I/O bus latencies introduced through components such as retimers and similar extension devices. However, in some systems, in order to support all aspects of the protocols utilized by the system, retimers may be configured to decode and re-encode signals sent through the retimer. For instance, some signals may require the retimer to modify fields in some types of signals, such as training sequences, ordered sets, and other examples. Accordingly, traditional retimers decode and re-encode all signals sent over the retimer(s) on the link. For instance, in PCIe, retimers can decode and re-encode data according to 8b/10b or 128b/130b encoding schemes, among other examples. Such decoding and re-encoding can be the source of at least some of the latency introduced through traditional retimers.

In some implementations, improved retimers can be provided that address at least some of the issues introduced above, including minimizing retimer latency, among other potential advantages. For example, a retimer can be provided that includes functionality for implementing multiple modes, including one or more low latency modes that can be selectively employed to forego traditional decoding and re-encoding of data on the link and instead merely forward the data as it was received on the sublink. One or more additional modes can also be provided through the retimer that encode/re-encode data before passing it along the link.

Figure 9:
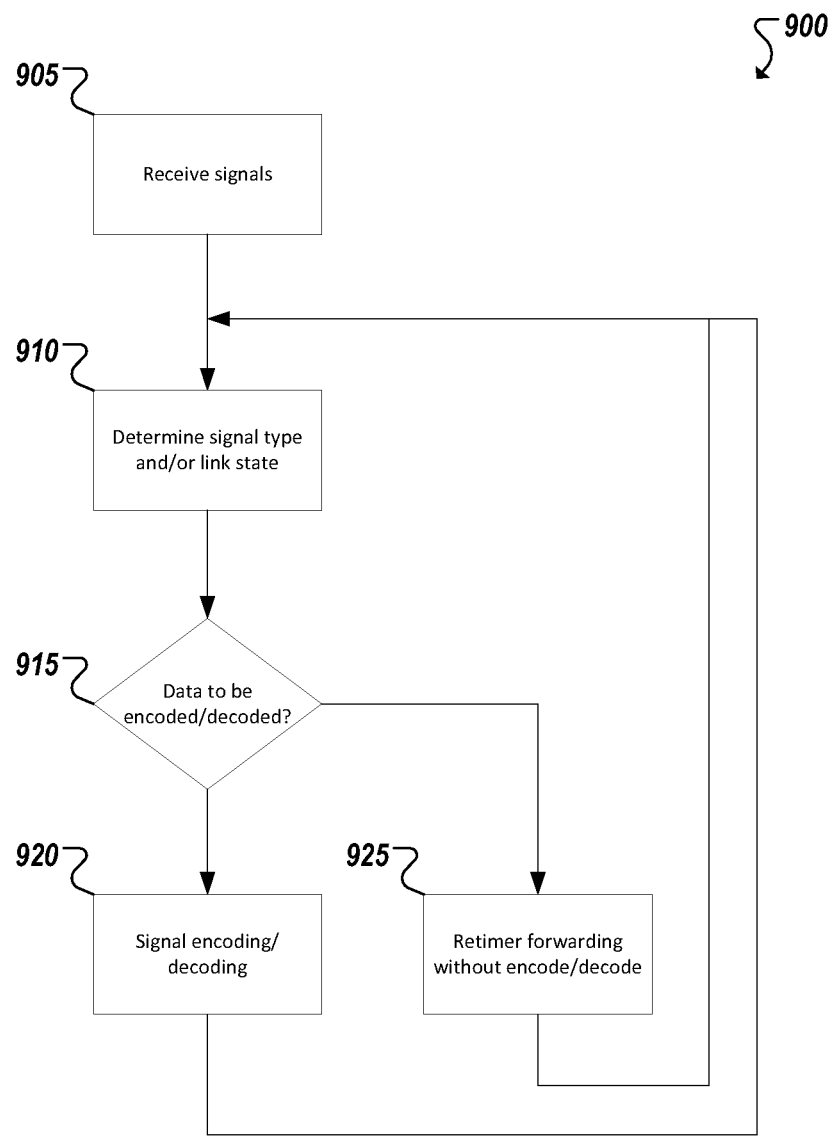
FIG. 9 is a flowchart showing an example technique for providing a multi-mode timer.

FIG. 9 illustrates an example flowchart 900 showing an example technique and algorithm for providing a multi-mode retimer. Signals can be received 905 on a port (e.g., an upstream port) of the retimer and logic within the retimer can determine 905 a signal type and/or link state that applies to the received signals. Conditions can be pre-defined for utilizing anyone of a plurality of operating modes of the retimer. The modes can include a low latency mode that forwards the data received on the upstream port directly for transmission on the transmission port (e.g., a downstream port) of the retimer. At least one other mode can be provided that at least partially decodes signals received on the upstream and/or re-encodes or modifies encoding of the received signal before transmitting the signal at the downstream port of the retimer. In some implementations, when link training (or link training data) is identified by the retimer, it can be determined (or pre-configured) that a higher-touch (and higher latency) mode is employed by the retimer allowing the retimer to modify some fields in training sets transmitted through the retimer. Some link states can be identified (e.g. in a register of the retimer) as relying on decoding and/or re-encoding at the retimer, and identifying that the link is in one of these states can trigger (e.g., at 915) use of a signal encoding/decoding mode (e.g., at 920) at the retimer. In another example, when the retimer identifies that the link is in a test mode, such as described in the examples of FIGS. 5-7 above, the retimer can employ a mode that allows the retimer to perform decoding (e.g., error detection), field modification (e.g., error reporting data encoding), and other tasks commensurate with the defined test mode. Other link states and data types can be properly forwarded by the retimer without decoding/re-encoding. For instance, data sent in an active link state (e.g., an L0 state) can be defined as being appropriate to merely forward through the retimer. Accordingly, upon identifying such link states (or data types) (e.g., at 910, 915), the retimer can employ a low latency mode (e.g., at 925) to simply pass the data through the retimer without any further (or at most minimal) processing of the data by the retimer. The retimer can conveniently, dynamically, and automatically toggle between the multiple modes it provides in response to detected signal types, link states, and other conditions to which one or more of the modes it to correspond.

PHY Layer Speed Detection

Modern interconnect fabrics can support multiple different connection speeds, and in some cases, support changing between two or more of the connection speeds during operation. A retimer is to support whatever connection speed is present on the link of which it is a part. Traditional retimers utilize logical physical layer logic that includes sometimes complicated and unreliable link state detection logic to detect or infer link state transitions and thereby also the likely connection speed utilized within the detected link state. As the link state detection logic processes information to determine the current link state, significant delays can result before the transmission speed of the retimer is adjusted (and re-adjusted) until the correct transmission speed is realized and the retimer is able to begin forwarding on received data at the appropriate connection speed. Further, as link state detection logic can sometimes infer incorrect link speeds, incorrect connection speed can be inferred by the link state detection logic causing errors on the links and further transmission delays, among other issues.

In some implementations, a retimer can be provided that includes speed detection logic, implemented at least in part using hardware at the electrical physical layer (or PHY) level, to detect, with precision, the actual speed of incoming data on the link. Rather than utilizing logical physical layer logic to "guess" the link connection speed, the actual transmission speed can be detected utilizing the PHY level speed detection logic. Indeed, the logical physical layer state detection logic for use in determining link transmission speed can be simplified or even foregone, in some implementations. The PHY level speed detection module can communicate the detected speed to the logical physical layer to permit the retimer to quickly and accurately support the detected speed.

Figure 10:
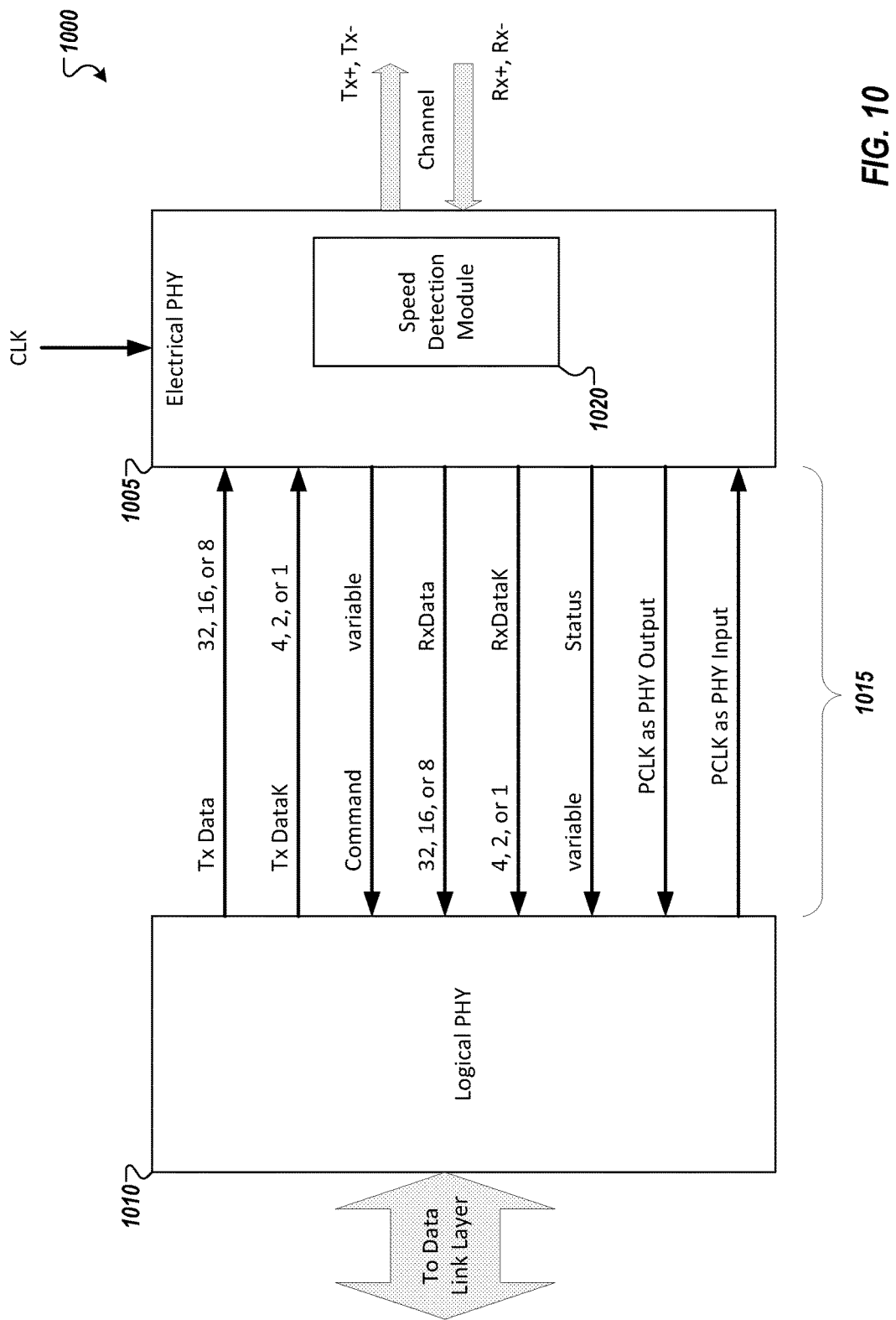
FIG. 10 illustrates a simplified block diagram of example physical layer logic of a retimer.

FIG. 10 is a simplified block diagram 1000 is shown illustrating example physical layer logic of an example retimer. In some implementations, a retimer can include a physical layer that includes an electrical PHY sublayer 1005 and a logical physical sublayer 1010. In some cases, the logical physical sublayer 1010 can further include a media access control (MAC) and physical coding (PCS) sublayers, among other functionality. An interface 1015 can be provided between the PHY 1005 and logical physical sublayers 1010. In some embodiments, such as in PCIe-compliant retimer implementations, the interface 1015 can be realized as a PHY Interface for PCI Express (PIPE), among other examples. PHY sublayer 1005 can further include a speed detection module 1020 that can detect the transmission speed of data on the link. The PHY sublayer 1005 can communicate the detected speed to the logical physical sublayer 1010 using interface 1015. In some implementations, the interface 1015 (e.g., a PIPE-based interface) can be extended to support communication of the speed (detected at the speed detection module 1020) to the logical physical layer 1010. In some implementations, speed detection module 1020 can be an analog speed detection module.

In some implementations, the speed detection module 1020 can perform speed detection automatically whenever the bus exits electrical IDLE. For instance, link training signals sent to recover the link or transition link state from IDLE can be used by the speed detection module 1020 to detect the transmission speed to be used for data on the link. In some cases, an interconnect can support one of multiple connection speeds. For instance, an incoming signal, in one implementation, can be at one of a 2.5, 5.0, 8.0, or 16.0 GT/s rate, and the speed detection module can detect which of the supported rates is currently being employed on the link. Using such speed detection circuitry (e.g., 1020) can, in some implementations, improve the accuracy and speed at which the retimer detects and adapts to the transmission speed of the link.

FIGS. 11A-11E are flowcharts 1100a-e illustrating example techniques in connection with a link implemented using an extension device, such as a retimer. For example, in FIG. 11A, entry into a test mode is identified 1105 for a link that includes two or more sublink based on the inclusion of one or more retimers (or other extension devices). A test mode signal is generated 1110 in connection with the test mode, the test mode signal including a test pattern and an error reporting sequence. The test mode signal is sent 1115 over a particular sublink. The test pattern included in the test mode signal can be used (e.g., by the receiver of the signal) to test the particular sublink for errors. The error reporting sequence is to progressively report the error status of each sublink that has been tested during the test mode. Errors identified on a preceding sublink can be added to and identified in the error reporting sequence included in the generated 1110 test mode signal.

Figure 11B:
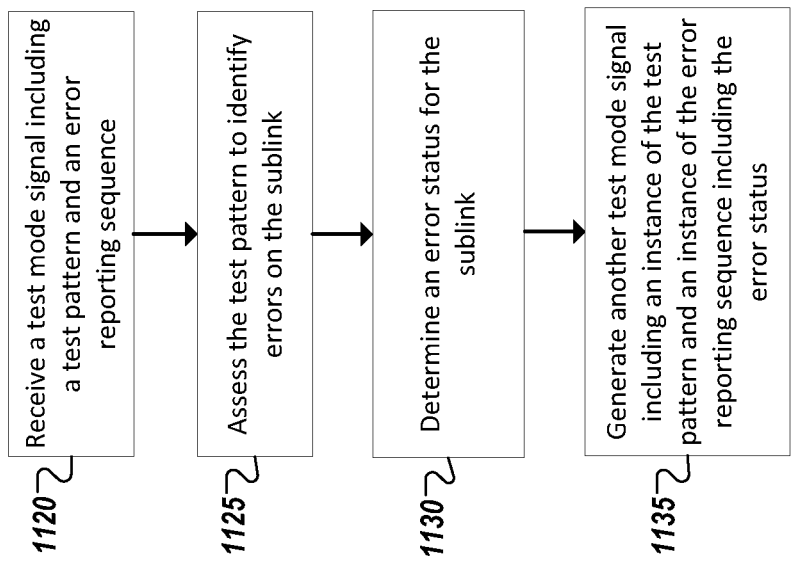
FIGS. 11A-11E are flowcharts illustrating example techniques in connection with a link implemented using an extension device.
Figure 11A:
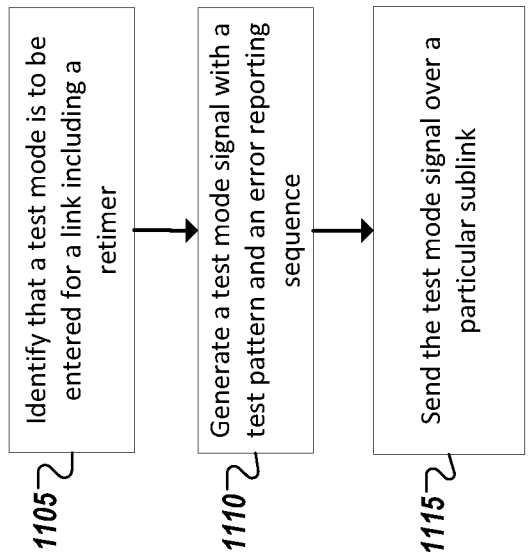

Turning to FIG. 11B, a test mode signal can be received 1120 over a particular sublink in a link that includes one or more extension devices and two or more sublinks during a test mode on the link. The received test mode signal may include a test pattern and an error reporting sequence. The test pattern is assessed to determine 1130 error status of the particular sublink. Another test mode signal is generated 1135 to be sent in the test mode that includes a newly generated instance of the test pattern (e.g., regenerated to ensure errors are not propagated across the link during the series of test mode signals) and an error reporting sequence that maintains error status information of previously-tested sublinks during the test mode as well as the determined (at 1130) error status of the particular sublink. In both the examples of FIGS. 11A and 11B, the test mode can be implemented using a loopback mode, among other examples.

Figures 11C, 11D:
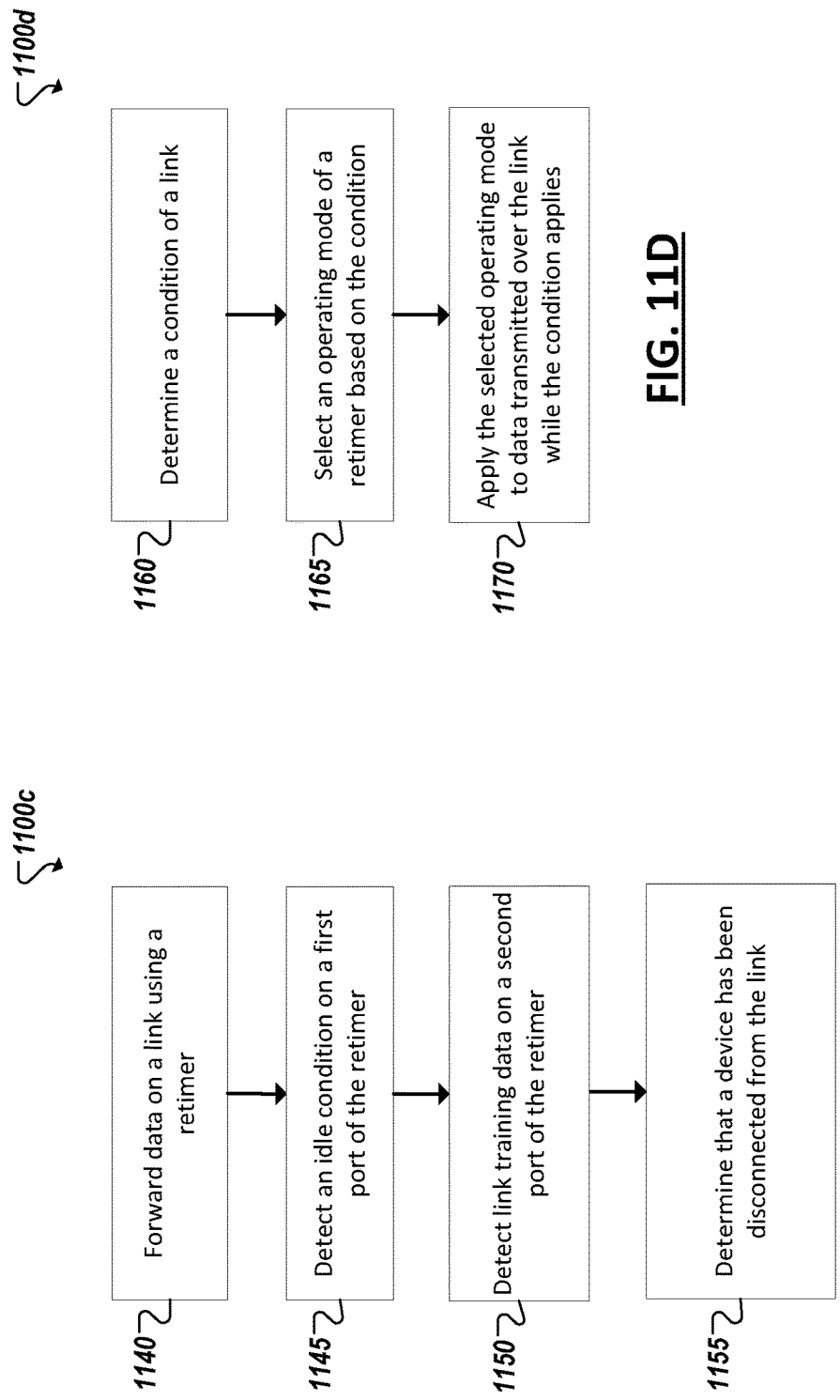

In the example of FIG. 11C, data is forwarded 1140 on a link using a retimer. Retimer logic can detect 1145 an idle condition on a first port (e.g., downstream or upstream) of the retimer. In some cases, the idle condition can be inferred. While the idle condition is detected, link training data can be received or otherwise detected 1150 on the second port (e.g., upstream or downstream) of the retimer. Based on the idle condition being detected 1145 on the first port together with the link training data (at 1150) on the second port, the retimer can determine that a device, formerly connected to the retimer using the first port, has been disconnected. The retimer can then enter a detect state to identify when another device replaces the disconnected device on the link, among other examples.

Turning to the example of FIG. 11D, a multi-mode extension device, such as a multi-mode retimer can be provided. A condition of a link on which the extension device is included can be determined 1160. For instance, a link state or data type can be determined based on data received on the link. A respective one of the operating modes of the extension device can be selected 1165 based on the condition. Modes can at least include a mode that permits decoding/encoding/modification of data forwarded over the extension device and another mode that foregoes decoding/encoding for lower latency processing, among other examples. The selected operating mode is applied 1170 to transmit the data over the link while the condition is applicable (e.g., switching modes again when a link state transition is identified, among other examples).

Figure 11E:
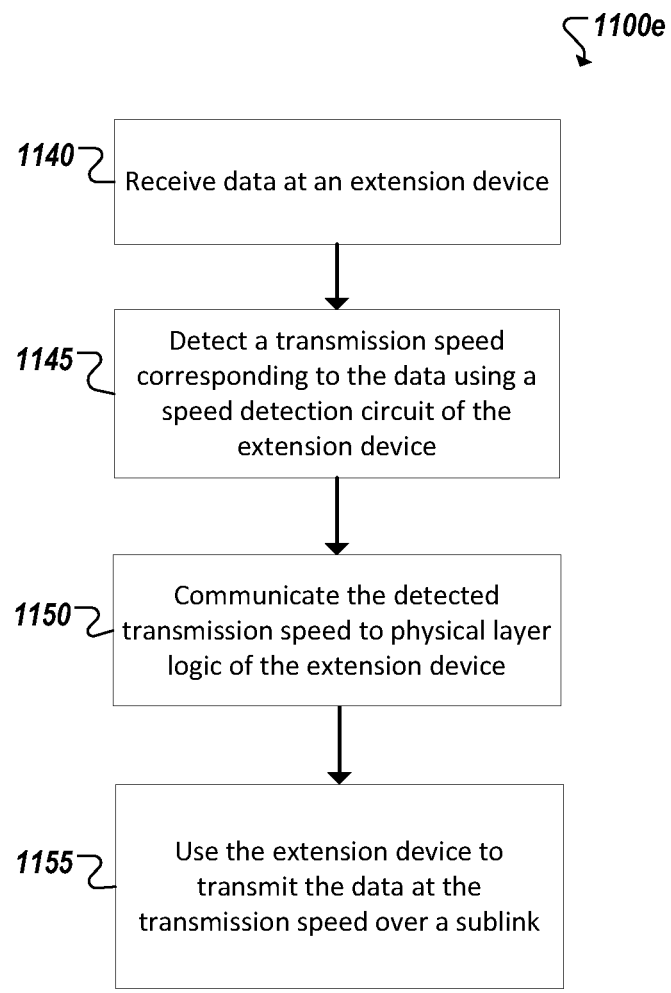

In the example of FIG. 11E, data is received 1140 at an extension device, such as a retimer, and hardware speed detection circuitry of the extension device is used to detect 1145 a transmission speed corresponding to the received data. The extension device can include a logical physical sublayer and electrical physical sublayer, and the speed detection module can be implemented using the electrical physical sublayer. The detected transmission speed result can be communicated 1150 from the electrical physical sublayer to the logical physical sublayer. The extension device can configure itself to process and transmit 1155 the data according to the detected speed.

Note that the apparatus', methods', and systems described above may be implemented in any electronic device or system as aforementioned. As specific illustrations, the figures below provide exemplary systems for utilizing the invention as described herein. As the systems below are described in more detail, a number of different interconnects are disclosed, described, and revisited from the discussion above. And as is readily apparent, the advances described above may be applied to any of those interconnects, fabrics, or architectures.

Figure 12:
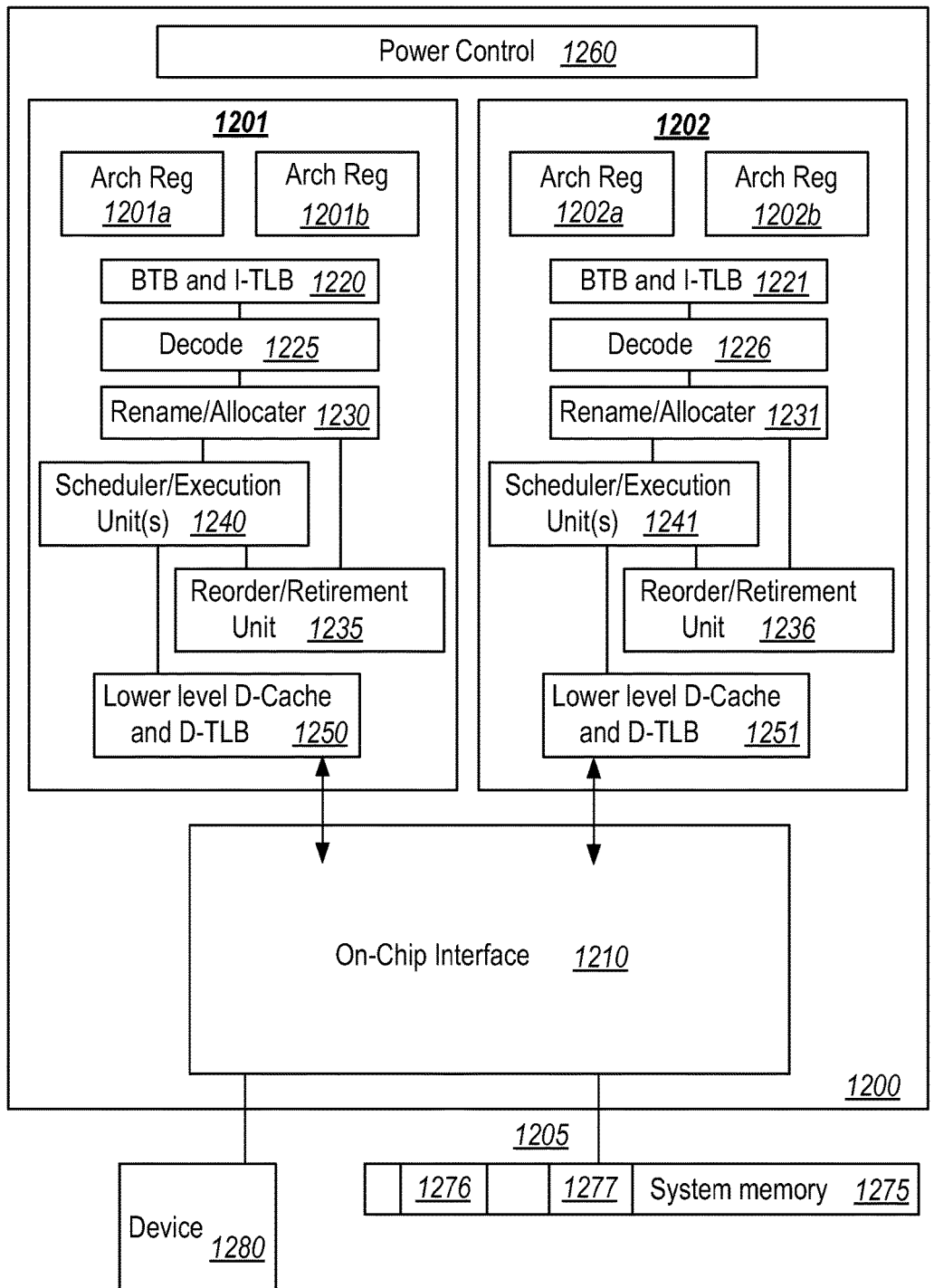
FIG. 12 illustrates an embodiment of a block diagram for a computing system including a multicore processor.

Referring to FIG. 12, an embodiment of a block diagram for a computing system including a multicore processor is depicted. Processor 1200 includes any processor or processing device, such as a microprocessor, an embedded processor, a digital signal processor (DSP), a network processor, a handheld processor, an application processor, a co-processor, a system on a chip (SOC), or other device to execute code. Processor 1200, in one embodiment, includes at least two cores—core 1201 and 1202, which may include asymmetric cores or symmetric cores (the illustrated embodiment). However, processor 1200 may include any number of processing elements that may be symmetric or asymmetric.

In one embodiment, a processing element refers to hardware or logic to support a software thread. Examples of hardware processing elements include: a thread unit, a thread slot, a thread, a process unit, a context, a context unit, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor (or processor socket) typically refers to an integrated circuit, which potentially includes any number of other processing elements, such as cores or hardware threads.

A core often refers to logic located on an integrated circuit capable of maintaining an independent architectural state, wherein each independently maintained architectural state is associated with at least some dedicated execution resources. In contrast to cores, a hardware thread typically refers to any logic located on an integrated circuit capable of maintaining an independent architectural state, wherein the independently maintained architectural states share access to execution resources. As can be seen, when certain resources are shared and others are dedicated to an architectural state, the line between the nomenclature of a hardware thread and core overlaps. Yet often, a core and a hardware thread are viewed by an operating system as individual logical processors, where the operating system is able to individually schedule operations on each logical processor.

Physical processor 1200, as illustrated in FIG. 12, includes two cores—core 1201 and 1202. Here, core 1201 and 1202 are considered symmetric cores, i.e. cores with the same configurations, functional units, and/or logic. In another embodiment, core 1201 includes an out-of-order processor core, while core 1202 includes an in-order processor core. However, cores 1201 and 1202 may be individually selected from any type of core, such as a native core, a software managed core, a core adapted to execute a native Instruction Set Architecture (ISA), a core adapted to execute a translated Instruction Set Architecture (ISA), a co-designed core, or other known core. In a heterogeneous core environment (i.e. asymmetric cores), some form of translation, such a binary translation, may be utilized to schedule or execute code on one or both cores. Yet to further the discussion, the functional units illustrated in core 1201 are described in further detail below, as the units in core 1202 operate in a similar manner in the depicted embodiment.

As depicted, core 1201 includes two hardware threads 1201*a* and 1201*b*, which may also be referred to as hardware thread slots 1201*a* and 1201*b*. Therefore, software entities, such as an operating system, in one embodiment potentially view processor 1200 as four separate processors, i.e., four logical processors or processing elements capable of executing four software threads concurrently. As alluded to above, a first thread is associated with architecture state registers 1201*a*, a second thread is associated with architecture state registers 1201*b*, a third thread may be associated with architecture state registers 1202*a*, and a fourth thread may be associated with architecture state registers 1202*b*. Here, each of the architecture state registers (1201*a*, 1201*b*, 1202*a*, and 1202*b*) may be referred to as processing elements, thread slots, or thread units, as described above. As illustrated, architecture state registers 1201*a* are replicated in architecture state registers 1201*b*, so individual architecture states/contexts are capable of being stored for logical processor 1201*a* and logical processor 1201*b*. In core 1201, other smaller resources, such as instruction pointers and renaming logic in allocator and renamer block 1230 may also be replicated for threads 1201*a* and 1201*b*. Some resources, such as re-order buffers in reorder/retirement unit 1235, ILTB 1220, load/store buffers, and queues may be shared through partitioning. Other resources, such as general purpose internal registers, page-table base register(s), low-level data-cache and data-TLB 1215, execution unit(s) 1240, and portions of out-of-order unit 1235 are potentially fully shared.

Processor 1200 often includes other resources, which may be fully shared, shared through partitioning, or dedicated by/to processing elements. In FIG. 12, an embodiment of a purely exemplary processor with illustrative logical units/resources of a processor is illustrated. Note that a processor may include, or omit, any of these functional units, as well as include any other known functional units, logic, or firmware not depicted. As illustrated, core 1201 includes a simplified, representative out-of-order (OOO) processor core. But an in-order processor may be utilized in different embodiments. The OOO core includes a branch target buffer 1220 to predict branches to be executed/taken and an instruction-translation buffer (I-TLB) 1220 to store address translation entries for instructions.

Core 1201 further includes decode module 1225 coupled to fetch unit 1220 to decode fetched elements. Fetch logic, in one embodiment, includes individual sequencers associated with thread slots 1201*a*, 1201*b*, respectively. Usually core 1201 is associated with a first ISA, which defines/specifies instructions executable on processor 1200. Often machine code instructions that are part of the first ISA include a portion of the instruction (referred to as an opcode), which references/specifies an instruction or operation to be performed. Decode logic 1225 includes circuitry that recognizes these instructions from their opcodes and passes the decoded instructions on in the pipeline for processing as defined by the first ISA. For example, as discussed in more detail below decoders 1225, in one embodiment, include logic designed or adapted to recognize specific instructions, such as transactional instruction. As a result of the recognition by decoders 1225, the architecture or core 1201 takes specific, predefined actions to perform tasks associated with the appropriate instruction. It is important to note that any of the tasks, blocks, operations, and methods described herein may be performed in response to a single or multiple instructions; some of which may be new or old instructions. Note decoders 1226, in one embodiment, recognize the same ISA (or a subset thereof). Alternatively, in a heterogeneous core environment, decoders 1226 recognize a second ISA (either a subset of the first ISA or a distinct ISA).

In one example, allocator and renamer block 1230 includes an allocator to reserve resources, such as register files to store instruction processing results. However, threads 1201*a* and 1201*b* are potentially capable of out-of-order execution, where allocator and renamer block 1230 also reserves other resources, such as reorder buffers to track instruction results. Unit 1230 may also include a register renamer to rename program/instruction reference registers to other registers internal to processor 1200. Reorder/retirement unit 1235 includes components, such as the reorder buffers mentioned above, load buffers, and store buffers, to support out-of-order execution and later in-order retirement of instructions executed out-of-order.

Scheduler and execution unit(s) block 1240, in one embodiment, includes a scheduler unit to schedule instructions/operation on execution units. For example, a floating point instruction is scheduled on a port of an execution unit that has an available floating point execution unit. Register files associated with the execution units are also included to store information instruction processing results. Exemplary execution units include a floating point execution unit, an integer execution unit, a jump execution unit, a load execution unit, a store execution unit, and other known execution units.

Lower level data cache and data translation buffer (D-TLB) 1250 are coupled to execution unit(s) 1240. The data cache is to store recently used/operated on elements, such as data operands, which are potentially held in memory coherency states. The D-TLB is to store recent virtual/linear to physical address translations. As a specific example, a processor may include a page table structure to break physical memory into a plurality of virtual pages.

Here, cores 1201 and 1202 share access to higher-level or further-out cache, such as a second level cache associated with on-chip interface 1210. Note that higher-level or further-out refers to cache levels increasing or getting further way from the execution unit(s). In one embodiment, higher-level cache is a last-level data cache—last cache in the memory hierarchy on processor 1200—such as a second or third level data cache. However, higher level cache is not so limited, as it may be associated with or include an instruction cache. A trace cache—a type of instruction cache—instead may be coupled after decoder 1225 to store recently decoded traces. Here, an instruction potentially refers to a macro-instruction (i.e. a general instruction recognized by the decoders), which may decode into a number of micro-instructions (micro-operations).

In the depicted configuration, processor 1200 also includes on-chip interface module 1210. Historically, a memory controller, which is described in more detail below, has been included in a computing system external to processor 1200. In this scenario, on-chip interface 1210 is to communicate with devices external to processor 1200, such as system memory 1275, a chipset (often including a memory controller hub to connect to memory 1275 and an I/O controller hub to connect peripheral devices), a memory controller hub, a northbridge, or other integrated circuit. And in this scenario, bus 1205 may include any known interconnect, such as multi-drop bus, a point-to-point interconnect, a serial interconnect, a parallel bus, a coherent (e.g. cache coherent) bus, a layered protocol architecture, a differential bus, and a GTL bus.

Memory 1275 may be dedicated to processor 1200 or shared with other devices in a system. Common examples of types of memory 1275 include DRAM, SRAM, non-volatile memory (NV memory), and other known storage devices. Note that device 1280 may include a graphic accelerator, processor or card coupled to a memory controller hub, data storage coupled to an I/O controller hub, a wireless transceiver, a flash device, an audio controller, a network controller, or other known device.

Recently however, as more logic and devices are being integrated on a single die, such as SOC, each of these devices may be incorporated on processor 1200. For example in one embodiment, a memory controller hub is on the same package and/or die with processor 1200. Here, a portion of the core (an on-core portion) 1210 includes one or more controller(s) for interfacing with other devices such as memory 1275 or a graphics device 1280. The configuration including an interconnect and controllers for interfacing with such devices is often referred to as an on-core (or un-core configuration). As an example, on-chip interface 1210 includes a ring interconnect for on-chip communication and a high-speed serial point-to-point link 1205 for off-chip communication. Yet, in the SOC environment, even more devices, such as the network interface, co-processors, memory 1275, graphics processor 1280, and any other known computer devices/interface may be integrated on a single die or integrated circuit to provide small form factor with high functionality and low power consumption.

In one embodiment, processor 1200 is capable of executing a compiler, optimization, and/or translator code 1277 to compile, translate, and/or optimize application code 1276 to support the apparatus and methods described herein or to interface therewith. A compiler often includes a program or set of programs to translate source text/code into target text/code. Usually, compilation of program/application code with a compiler is done in multiple phases and passes to transform hi-level programming language code into low-level machine or assembly language code. Yet, single pass compilers may still be utilized for simple compilation. A compiler may utilize any known compilation techniques and perform any known compiler operations, such as lexical analysis, preprocessing, parsing, semantic analysis, code generation, code transformation, and code optimization.

Larger compilers often include multiple phases, but most often these phases are included within two general phases: (1) a front-end, i.e. generally where syntactic processing, semantic processing, and some transformation/optimization may take place, and (2) a back-end, i.e. generally where analysis, transformations, optimizations, and code generation takes place. Some compilers refer to a middle, which illustrates the blurring of delineation between a front-end and back end of a compiler. As a result, reference to insertion, association, generation, or other operation of a compiler may take place in any of the aforementioned phases or passes, as well as any other known phases or passes of a compiler. As an illustrative example, a compiler potentially inserts operations, calls, functions, etc. in one or more phases of compilation, such as insertion of calls/operations in a front-end phase of compilation and then transformation of the calls/operations into lower-level code during a transformation phase. Note that during dynamic compilation, compiler code or dynamic optimization code may insert such operations/calls, as well as optimize the code for execution during runtime. As a specific illustrative example, binary code (already compiled code) may be dynamically optimized during runtime. Here, the program code may include the dynamic optimization code, the binary code, or a combination thereof.

Similar to a compiler, a translator, such as a binary translator, translates code either statically or dynamically to optimize and/or translate code. Therefore, reference to execution of code, application code, program code, or other software environment may refer to: (1) execution of a compiler program(s), optimization code optimizer, or translator either dynamically or statically, to compile program code, to maintain software structures, to perform other operations, to optimize code, or to translate code; (2) execution of main program code including operations/calls, such as application code that has been optimized/compiled; (3) execution of other program code, such as libraries, associated with the main program code to maintain software structures, to perform other software related operations, or to optimize code; or (4) a combination thereof.

Figure 13:
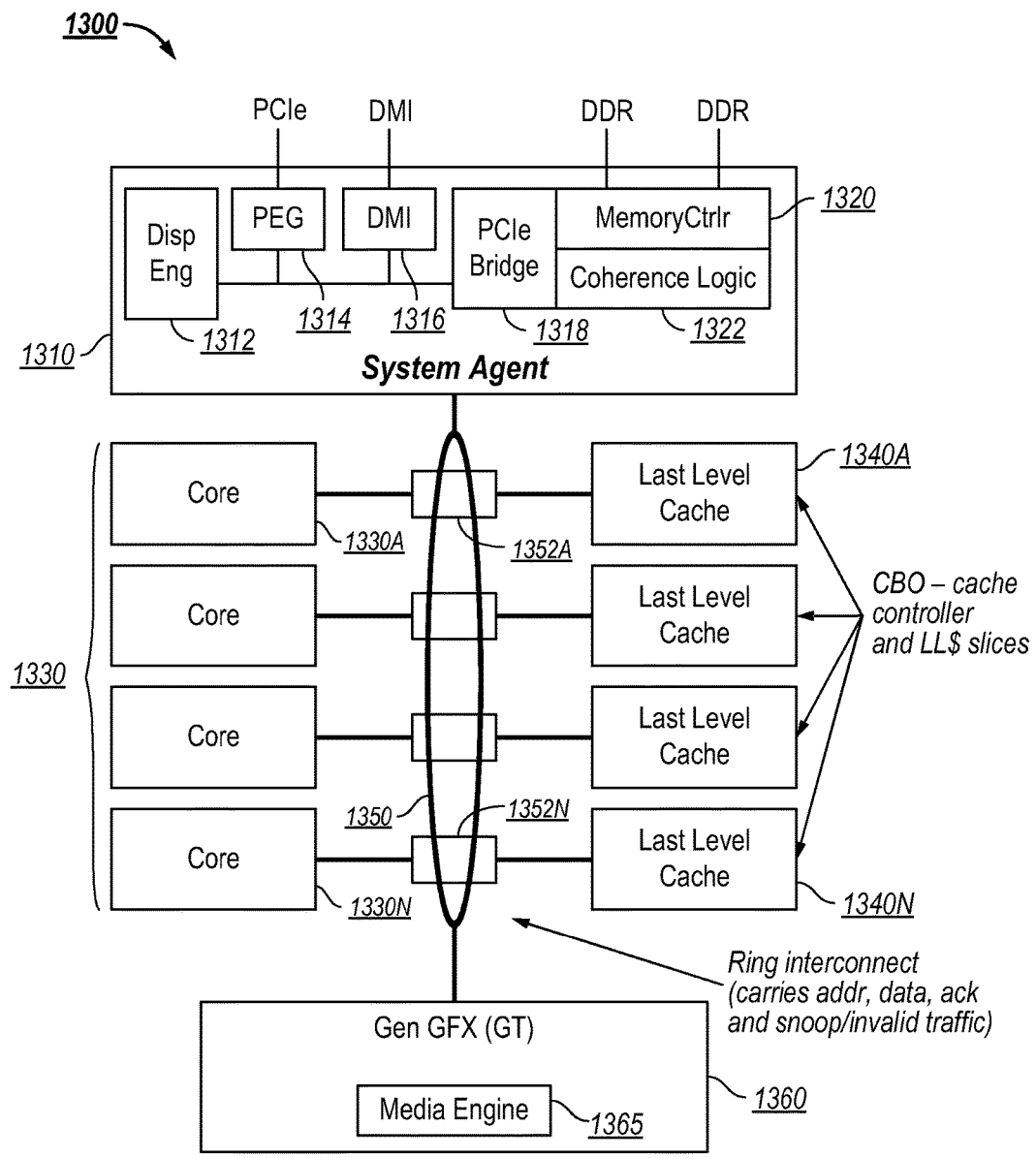
FIG. 13 illustrates another embodiment of a block diagram for a computing system including a multicore processor.

Referring now to FIG. 13, shown is a block diagram of an embodiment of a multicore processor. As shown in the embodiment of FIG. 13, processor 1300 includes multiple domains. Specifically, a core domain 1330 includes a plurality of cores 1330A-1330N, a graphics domain 1360 includes one or more graphics engines having a media engine 1365, and a system agent domain 1310.

In various embodiments, system agent domain 1310 handles power control events and power management, such that individual units of domains 1330 and 1360 (e.g. cores and/or graphics engines) are independently controllable to dynamically operate at an appropriate power mode/level (e.g. active, turbo, sleep, hibernate, deep sleep, or other Advanced Configuration Power Interface like state) in light of the activity (or inactivity) occurring in the given unit. Each of domains 1330 and 1360 may operate at different voltage and/or power, and furthermore the individual units within the domains each potentially operate at an independent frequency and voltage. Note that while only shown with three domains, understand the scope of the present invention is not limited in this regard and additional domains may be present in other embodiments.

As shown, each core 1330 further includes low level caches in addition to various execution units and additional processing elements. Here, the various cores are coupled to each other and to a shared cache memory that is formed of a plurality of units or slices of a last level cache (LLC) 1340A-1340N; these LLCs often include storage and cache controller functionality and are shared amongst the cores, as well as potentially among the graphics engine too.

As seen, a ring interconnect 1350 couples the cores together, and provides interconnection between the core domain 1330, graphics domain 1360 and system agent circuitry 1310, via a plurality of ring stops 1352A-1352N, each at a coupling between a core and LLC slice. As seen in FIG. 13, interconnect 1350 is used to carry various information, including address information, data information, acknowledgement information, and snoop/invalid information. Although a ring interconnect is illustrated, any known on-die interconnect or fabric may be utilized. As an illustrative example, some of the fabrics discussed above (e.g. another on-die interconnect, On-chip System Fabric (OSF), an Advanced Microcontroller Bus Architecture (AMBA) interconnect, a multi-dimensional mesh fabric, or other known interconnect architecture) may be utilized in a similar fashion.

As further depicted, system agent domain 1310 includes display engine 1312 which is to provide control of and an interface to an associated display. System agent domain 1310 may include other units, such as: an integrated memory controller 1320 that provides for an interface to a system memory (e.g., a DRAM implemented with multiple DIMMs; coherence logic 1322 to perform memory coherence operations. Multiple interfaces may be present to enable interconnection between the processor and other circuitry. For example, in one embodiment at least one direct media interface (DMI) 1316 interface is provided as well as one or more PCIe™ interfaces 1314. The display engine and these interfaces typically couple to memory via a PCIe™ bridge 1318. Still further, to provide for communications between other agents, such as additional processors or other circuitry, one or more other interfaces may be provided.

Figure 14:
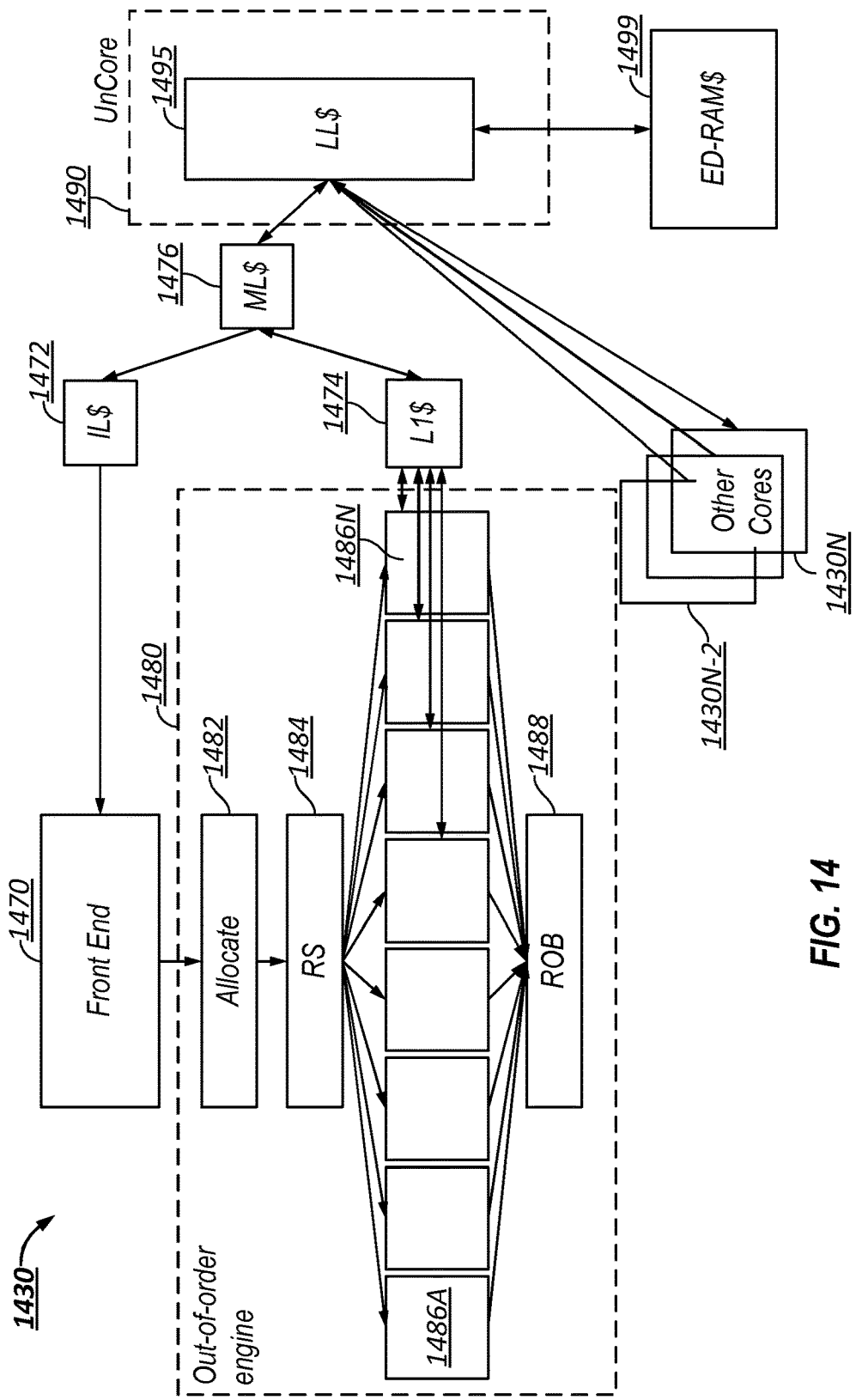
FIG. 14 illustrates an embodiment of a block diagram for a processor.

Referring now to FIG. 14, shown is a block diagram of a representative core; specifically, logical blocks of a back-end of a core, such as core 1330 from FIG. 13. In general, the structure shown in FIG. 14 includes an out-of-order processor that has a front end unit 1470 used to fetch incoming instructions, perform various processing (e.g. caching, decoding, branch predicting, etc.) and passing instructions/operations along to an out-of-order (OOO) engine 1480. OOO engine 1480 performs further processing on decoded instructions.

Specifically in the embodiment of FIG. 14, out-of-order engine 1480 includes an allocate unit 1482 to receive decoded instructions, which may be in the form of one or more micro-instructions or uops, from front end unit 1470, and allocate them to appropriate resources such as registers and so forth. Next, the instructions are provided to a reservation station 1484, which reserves resources and schedules them for execution on one of a plurality of execution units 1486A-1486N. Various types of execution units may be present, including, for example, arithmetic logic units (ALUs), load and store units, vector processing units (VPUs), floating point execution units, among others. Results from these different execution units are provided to a reorder buffer (ROB) 1488, which take unordered results and return them to correct program order.

Still referring to FIG. 14, note that both front end unit 1470 and out-of-order engine 1480 are coupled to different levels of a memory hierarchy. Specifically shown is an instruction level cache 1472, that in turn couples to a mid-level cache 1476, that in turn couples to a last level cache 1495. In one embodiment, last level cache 1495 is implemented in an on-chip (sometimes referred to as uncore) unit 1490. As an example, unit 1490 is similar to system agent 1310 of FIG. 13. As discussed above, uncore 1490 communicates with system memory 1499, which, in the illustrated embodiment, is implemented via ED RAM. Note also that the various execution units 1486 within out-of-order engine 1480 are in communication with a first level cache 1474 that also is in communication with mid-level cache 1476. Note also that additional cores 1430N-2-1430N can couple to LLC 1495. Although shown at this high level in the embodiment of FIG. 14, understand that various alterations and additional components may be present.

Figure 15:
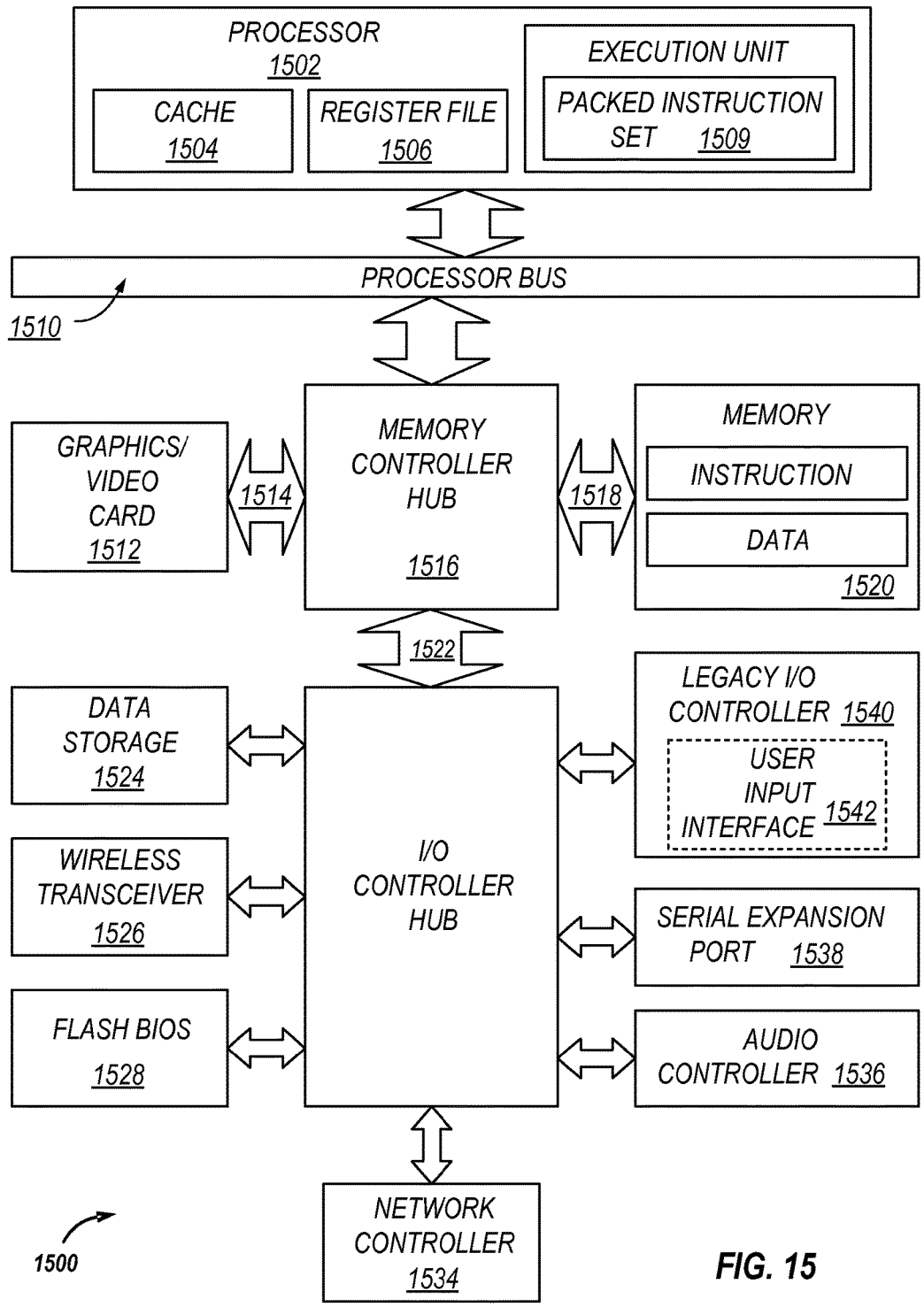
FIG. 15 illustrates another embodiment of a block diagram for a computing system including a processor.

Turning to FIG. 15, a block diagram of an exemplary computer system formed with a processor that includes execution units to execute an instruction, where one or more of the interconnects implement one or more features in accordance with one embodiment of the present invention is illustrated. System 1500 includes a component, such as a processor 1502 to employ execution units including logic to perform algorithms for process data, in accordance with the present invention, such as in the embodiment described herein. System 1500 is representative of processing systems based on the PENTIUM III™, PENTIUM 4™, Xeon™, Itanium, XScale™ and/or StrongARM™ microprocessors, although other systems (including PCs having other microprocessors, engineering workstations, set-top boxes and the like) may also be used. In one embodiment, sample system 1500 executes a version of the WINDOWS™ operating system available from Microsoft Corporation of Redmond, Wash., although other operating systems (UNIX and Linux for example), embedded software, and/or graphical user interfaces, may also be used. Thus, embodiments of the present invention are not limited to any specific combination of hardware circuitry and software.

Embodiments are not limited to computer systems. Alternative embodiments of the present invention can be used in other devices such as handheld devices and embedded applications. Some examples of handheld devices include cellular phones, Internet Protocol devices, digital cameras, personal digital assistants (PDAs), and handheld PCs. Embedded applications can include a micro controller, a digital signal processor (DSP), system on a chip, network computers (NetPC), set-top boxes, network hubs, wide area network (WAN) switches, or any other system that can perform one or more instructions in accordance with at least one embodiment.

In this illustrated embodiment, processor 1502 includes one or more execution units 1508 to implement an algorithm that is to perform at least one instruction. One embodiment may be described in the context of a single processor desktop or server system, but alternative embodiments may be included in a multiprocessor system. System 1500 is an example of a 'hub' system architecture. The computer system 1500 includes a processor 1502 to process data signals. The processor 1502, as one illustrative example, includes a complex instruction set computer (CISC) microprocessor, a reduced instruction set computing (RISC) microprocessor, a very long instruction word (VLIW) microprocessor, a processor implementing a combination of instruction sets, or any other processor device, such as a digital signal processor, for example. The processor 1502 is coupled to a processor bus 1510 that transmits data signals between the processor 1502 and other components in the system 1500. The elements of system 1500 (e.g. graphics accelerator 1512, memory controller hub 1516, memory 1520, I/O controller hub 1524, wireless transceiver 1526, Flash BIOS 1528, Network controller 1534, Audio controller 1536, Serial expansion port 1538, I/O controller 1540, etc.) perform their conventional functions that are well known to those familiar with the art.

In one embodiment, the processor 1502 includes a Level 1 (L1) internal cache memory 1504. Depending on the architecture, the processor 1502 may have a single internal cache or multiple levels of internal caches. Other embodiments include a combination of both internal and external caches depending on the particular implementation and needs. Register file 1506 is to store different types of data in various registers including integer registers, floating point registers, vector registers, banked registers, shadow registers, checkpoint registers, status registers, and instruction pointer register.

Execution unit 1508, including logic to perform integer and floating point operations, also resides in the processor 1502. The processor 1502, in one embodiment, includes a microcode (ucode) ROM to store microcode, which when executed, is to perform algorithms for certain macroinstructions or handle complex scenarios. Here, microcode is potentially updateable to handle logic bugs/fixes for processor 1502. For one embodiment, execution unit 1508 includes logic to handle a packed instruction set 1509. By including the packed instruction set 1509 in the instruction set of a general-purpose processor 1502, along with associated circuitry to execute the instructions, the operations used by many multimedia applications may be performed using packed data in a general-purpose processor 1502. Thus, many multimedia applications are accelerated and executed more efficiently by using the full width of a processor's data bus for performing operations on packed data. This potentially eliminates the need to transfer smaller units of data across the processor's data bus to perform one or more operations, one data element at a time.

Alternate embodiments of an execution unit 1508 may also be used in micro controllers, embedded processors, graphics devices, DSPs, and other types of logic circuits. System 1500 includes a memory 1520. Memory 1520 includes a dynamic random access memory (DRAM) device, a static random access memory (SRAM) device, flash memory device, or other memory device. Memory 1520 stores instructions and/or data represented by data signals that are to be executed by the processor 1502.

Note that any of the aforementioned features or aspects of the invention may be utilized on one or more interconnect illustrated in FIG. 15. For example, an on-die interconnect (ODI), which is not shown, for coupling internal units of processor 1502 implements one or more aspects of the invention described above. Or the invention is associated with a processor bus 1510 (e.g. other known high performance computing interconnect), a high bandwidth memory path 1518 to memory 1520, a point-to-point link to graphics accelerator 1512 (e.g. a Peripheral Component Interconnect express (PCIe) compliant fabric), a controller hub interconnect 1522, an I/O or other interconnect (e.g. USB, PCI, PCIe) for coupling the other illustrated components. Some examples of such components include the audio controller 1536, firmware hub (flash BIOS) 1528, wireless transceiver 1526, data storage 1524, legacy I/O controller 1510 containing user input and keyboard interfaces 1542, a serial expansion port 1538 such as Universal Serial Bus (USB), and a network controller 1534. The data storage device 1524 can comprise a hard disk drive, a floppy disk drive, a CD-ROM device, a flash memory device, or other mass storage device.

Figure 16:
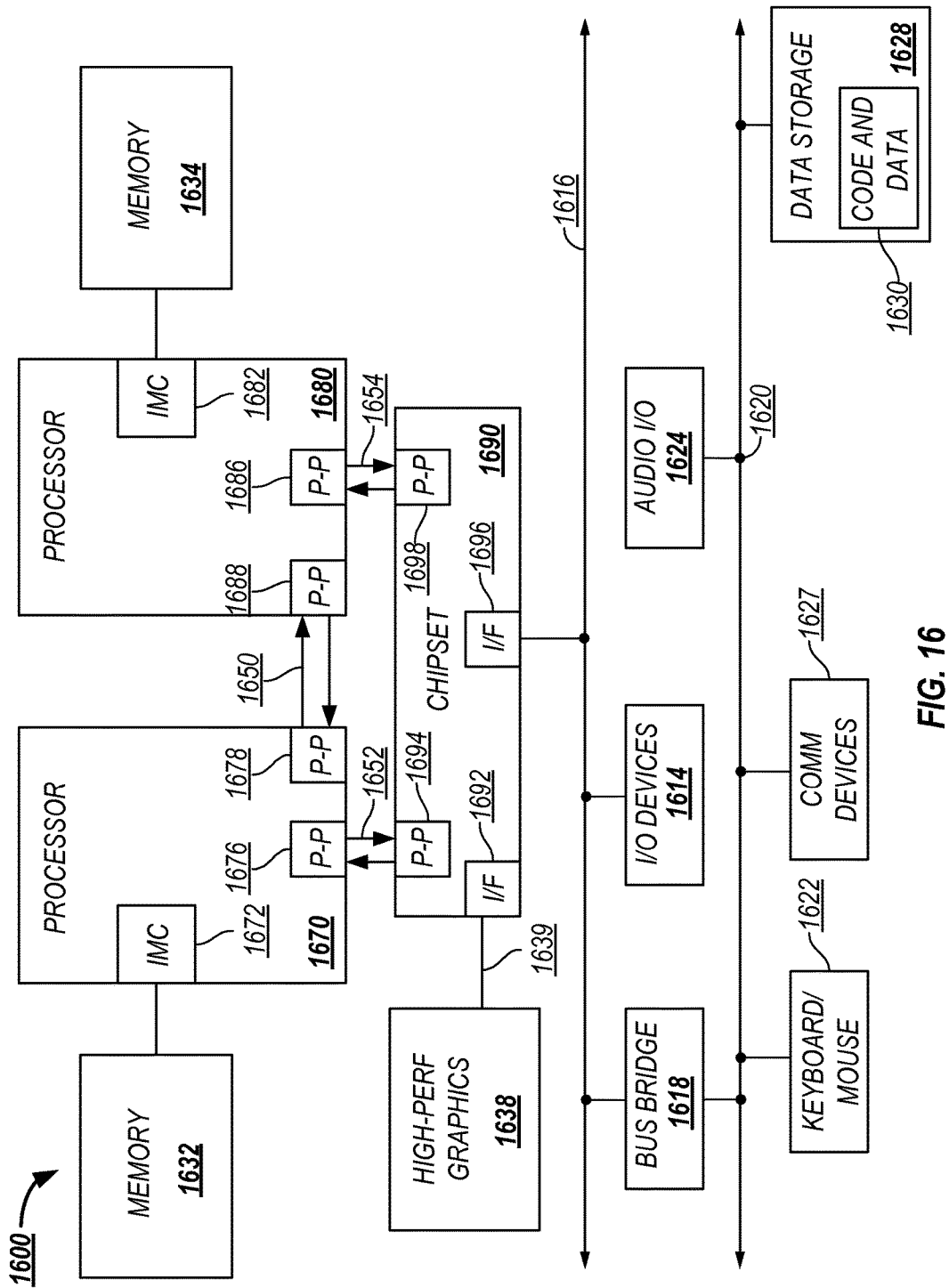
FIG. 16 illustrates an embodiment of a block for a computing system including multiple processors.

Referring now to FIG. 16, shown is a block diagram of a second system 1600 in accordance with an embodiment of the present invention. As shown in FIG. 16, multiprocessor system 1600 is a point-to-point interconnect system, and includes a first processor 1670 and a second processor 1680 coupled via a point-to-point interconnect 1650. Each of processors 1670 and 1680 may be some version of a processor. In one embodiment, 1652 and 1654 are part of a serial, point-to-point coherent interconnect fabric, such as a high-performance architecture. As a result, the invention may be implemented within the QPI architecture.

While shown with only two processors 1670, 1680, it is to be understood that the scope of the present invention is not so limited. In other embodiments, one or more additional processors may be present in a given processor.

Processors 1670 and 1680 are shown including integrated memory controller units 1672 and 1682, respectively. Processor 1670 also includes as part of its bus controller units point-to-point (P-P) interfaces 1676 and 1678; similarly, second processor 1680 includes P-P interfaces 1686 and 1688. Processors 1670, 1680 may exchange information via a point-to-point (P-P) interface 1650 using P-P interface circuits 1678, 1688. As shown in FIG. 16, IMCs 1672 and 1682 couple the processors to respective memories, namely a memory 1632 and a memory 1634, which may be portions of main memory locally attached to the respective processors.

Processors 1670, 1680 each exchange information with a chipset 1690 via individual P-P interfaces 1652, 1654 using point to point interface circuits 1676, 1694, 1686, 1698. Chipset 1690 also exchanges information with a high-performance graphics circuit 1638 via an interface circuit 1692 along a high-performance graphics interconnect 1639.

A shared cache (not shown) may be included in either processor or outside of both processors; yet connected with the processors via P-P interconnect, such that either or both processors' local cache information may be stored in the shared cache if a processor is placed into a low power mode.

Chipset 1690 may be coupled to a first bus 1616 via an interface 1696. In one embodiment, first bus 1616 may be a Peripheral Component Interconnect (PCI) bus, or a bus such as a PCI Express bus or another third generation I/O interconnect bus, although the scope of the present invention is not so limited.

As shown in FIG. 16, various I/O devices 1614 are coupled to first bus 1616, along with a bus bridge 1618 which couples first bus 1616 to a second bus 1620. In one embodiment, second bus 1620 includes a low pin count (LPC) bus. Various devices are coupled to second bus 1620 including, for example, a keyboard and/or mouse 1622, communication devices 1627 and a storage unit 1628 such as a disk drive or other mass storage device which often includes instructions/code and data 1630, in one embodiment. Further, an audio I/O 1624 is shown coupled to second bus 1620. Note that other architectures are possible, where the included components and interconnect architectures vary. For example, instead of the point-to-point architecture of FIG. 16, a system may implement a multi-drop bus or other such architecture.

Figure 17:
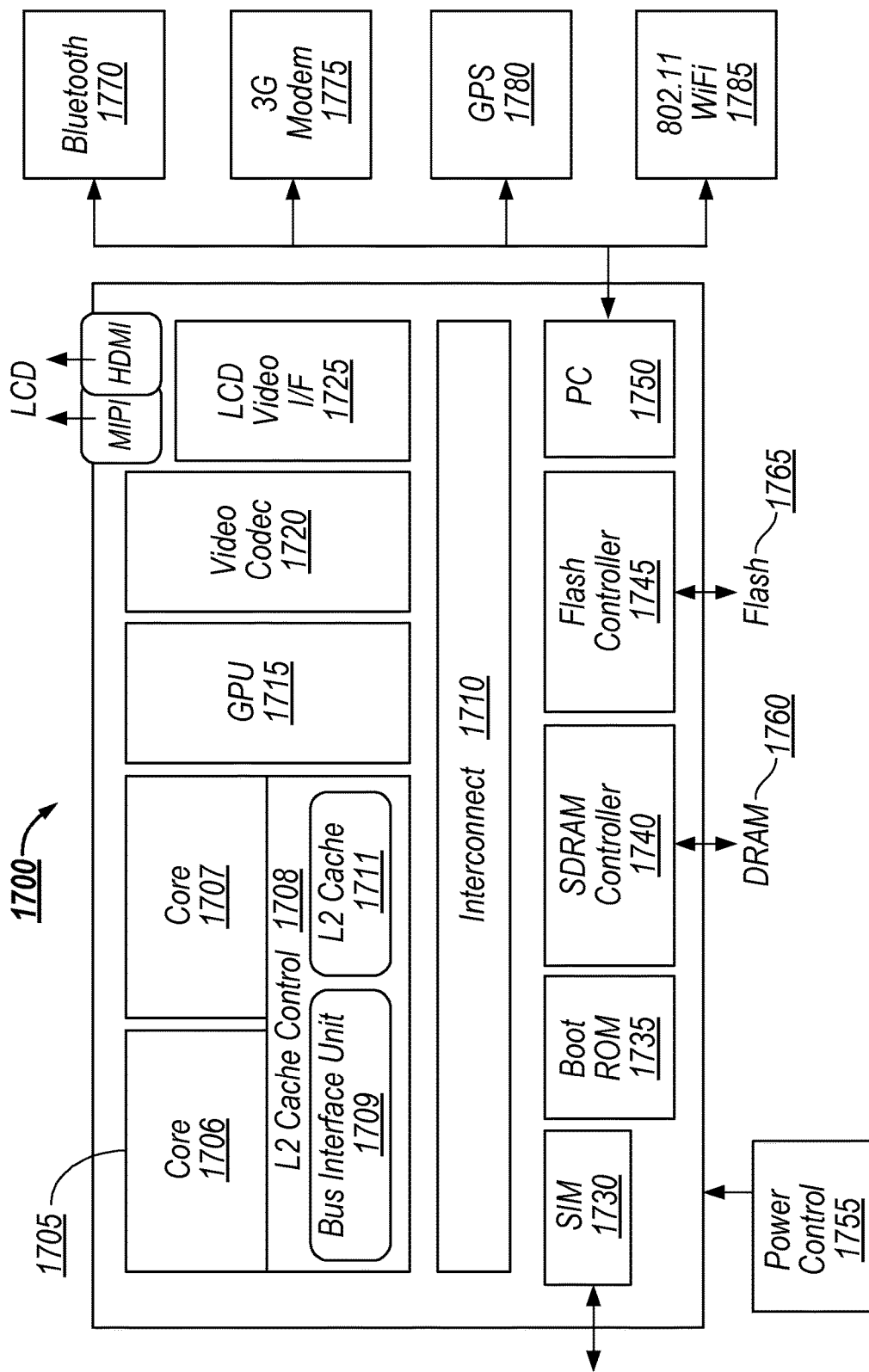
FIG. 17 illustrates an example system implemented as system on chip (SoC).

Turning next to FIG. 17, an embodiment of a system on-chip (SOC) design in accordance with the inventions is depicted. As a specific illustrative example, SOC 1700 is included in user equipment (UE). In one embodiment, UE refers to any device to be used by an end-user to communicate, such as a hand-held phone, smartphone, tablet, ultra-thin notebook, notebook with broadband adapter, or any other similar communication device. Often a UE connects to a base station or node, which potentially corresponds in nature to a mobile station (MS) in a GSM network.

Here, SOC 1700 includes 2 cores—1706 and 1707. Similar to the discussion above, cores 1706 and 1707 may conform to an Instruction Set Architecture, such as an Intel® Architecture Core™-based processor, an Advanced Micro Devices, Inc. (AMD) processor, a MIPS-based processor, an ARM-based processor design, or a customer thereof, as well as their licensees or adopters. Cores 1706 and 1707 are coupled to cache control 1708 that is associated with bus interface unit 1709 and L2 cache 1711 to communicate with other parts of system 1700. Interconnect 1710 includes an on-chip interconnect, such as an IOSF, AMBA, or other interconnect discussed above, which potentially implements one or more aspects of described herein.

Interface 1710 provides communication channels to the other components, such as a Subscriber Identity Module (SIM) 1730 to interface with a SIM card, a boot rom 1735 to hold boot code for execution by cores 1706 and 1707 to initialize and boot SOC 1700, a SDRAM controller 1740 to interface with external memory (e.g. DRAM 1760), a flash controller 1745 to interface with non-volatile memory (e.g. Flash 1765), a peripheral control 1750 (e.g. Serial Peripheral Interface) to interface with peripherals, video codecs 1720 and Video interface 1725 to display and receive input (e.g. touch enabled input), GPU 1715 to perform graphics related computations, etc. Any of these interfaces may incorporate aspects of the invention described herein.

In addition, the system illustrates peripherals for communication, such as a Bluetooth module 1770, 3G modem 1775, GPS 1785, and WiFi 1785. Note as stated above, a UE includes a radio for communication. As a result, these peripheral communication modules are not all required. However, in a UE some form a radio for external communication is to be included.

While the present invention has been described with respect to a limited number of embodiments, those skilled in the art will appreciate numerous modifications and variations therefrom. It is intended that the appended claims cover all such modifications and variations as fall within the true spirit and scope of this present invention.

A design may go through various stages, from creation to simulation to fabrication. Data representing a design may represent the design in a number of manners. First, as is useful in simulations, the hardware may be represented using a hardware description language or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In any representation of the design, the data may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider may store on a tangible, machine-readable medium, at least temporarily, an article, such as information encoded into a carrier wave, embodying techniques of embodiments of the present invention.

A module as used herein refers to any combination of hardware, software, and/or firmware. As an example, a module includes hardware, such as a micro-controller, associated with a non-transitory medium to store code adapted to be executed by the micro-controller. Therefore, reference to a module, in one embodiment, refers to the hardware, which is specifically configured to recognize and/or execute the code to be held on a non-transitory medium. Furthermore, in another embodiment, use of a module refers to the non-transitory medium including the code, which is specifically adapted to be executed by the microcontroller to perform predetermined operations. And as can be inferred, in yet another embodiment, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one embodiment, use of the term logic includes hardware, such as transistors, registers, or other hardware, such as programmable logic devices.

Use of the phrase 'configured to,' in one embodiment, refers to arranging, putting together, manufacturing, offering to sell, importing and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'to,' 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, i.e. reset, while an updated value potentially includes a low logical value, i.e. set. Note that any combination of values may be utilized to represent any number of states.

The embodiments of methods, hardware, software, firmware or code set forth above may be implemented via instructions or code stored on a machine-accessible, machine readable, computer accessible, or computer readable medium which are executable by a processing element. A non-transitory machine-accessible/readable medium includes any mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash memory devices; electrical storage devices; optical storage devices; acoustical storage devices; other form of storage devices for holding information received from transitory (propagated) signals (e.g., carrier waves, infrared signals, digital signals); etc, which are to be distinguished from the non-transitory mediums that may receive information there from.

Instructions used to program logic to perform embodiments of the invention may be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer).

[The following examples pertain to embodiments in accordance with this Specification. One or more embodiments may provide an apparatus, a system, a machine readable storage, a machine readable medium, hardware- and/or software-based logic, and a method to generate a test mode signal to include a test pattern and an error reporting sequence, and send the test mode signal on a link to comprise one or more extension devices and two or more sublinks, where the test mode signal is to be sent on a particular one of the sublinks, the test pattern is to be used by a receiving device to identify errors on the particular sublink, and the error reporting sequence is to be encoded with error information to describe error status of sublinks in the plurality of sublinks.

In at least one example, the test mode signal is sent within a loopback test mode and instances of the test mode signal are to be sent from a first device on the link over the one or more extension devices to a second device and further sent from the second device at least one over the one or more extension devices back to the first device.

In at least one example, at least one of the instances of the test mode signal is received from another device on another one of the sublinks of the link, where each instance of the test mode signal includes an instance of the test pattern and an instance of the error reporting sequence.

In at least one example, error detection logic is provided to determine one or more errors on the other sublink based on the instance of the test pattern.

In at least one example, errors are determined for a sublink based on an identification that an instance of the test pattern as included in a test mode signal received over the sublink deviates from an expected value for the test pattern.

In at least one example, the extension device comprises a retimer.

In at least one example, the apparatus comprises the retimer.

In at least one example, the error reporting sequence comprises a plurality of segments and each segment describes error status of a respective one of the sublinks.

In at least one example, each segment describes one of a downstream channel and an upstream channel of a respective sublink.

In at least one example, each segment comprises one or more ordered sets and at least a portion of each of the ordered sets is provided to be encoded to identify error status of at least one of the sublinks.

In at least one example, each ordered set comprises a respective SKP ordered set.

In at least one example, the one or more extension devices comprise at least two extension devices, the two or more sublinks comprise three sublinks, and the plurality of segments comprise at least five segments.

In at least one example, error information detected for a preceding sublink is encoded in the error reporting sequence and error information is maintained in the error reporting sequence for previously detected error status of other sublinks in the two or more sublinks.

In at least one example, the error information includes one or more of: a number of errors detected for a sublink, a lane of the link on which an appeared, and a location of errors detected in a received test pattern.

In at least one example, the test pattern comprises a predefined pattern to be regenerated at each sublink during a test.

In at least one example, the test pattern includes one or more ordered sets.

In at least one example, the one or more ordered sets electrical idle exit sequence ordered set (EIEOS).

In at least one example, control logic is to identify that the link is in a test mode, and the test mode signal is sent in accordance with the test mode.

In at least one example, the test pattern is a fixed test pattern defined for the test mode.

One or more embodiments may provide an apparatus, a system, a machine readable storage, a machine readable medium, hardware- and/or software-based logic, and a method to receive a test mode signal on a link in a test mode, where the link comprises at least one extension device and two or more sublinks, the test mode signal includes a test pattern and an error reporting sequence, the test mode signal is sent on a particular one of the sublinks, and the error reporting sequence is to be encoded with error information to describe error status of sublinks in the plurality of sublinks, and assess the test pattern in the test mode signal to identify an error status of the particular sublink.

In at least one example, the test pattern is assessed to determine whether the test pattern deviates from an expected test pattern.

In at least one example, the test pattern is defined for a test mode, the test mode includes a test of each sublink of the link, and a respective instance of the test pattern is to be generated and sent in each of the tests of the sublinks to determine whether the respective instance of the test pattern received at the end of the respective sublink deviates from the defined test pattern.

In at least one example, each sublink comprises a respective upstream channel and downstream channel, and an instance of the test pattern is to be sent on each of the upstream and downstream channels of each of the sublinks.

In at least one example, the error status identifies one or more errors detected on the particular sublink based on the test pattern.

In at least one example, the error status identifies a number of errors detected on the particular sublink.

In at least one example, the error status identifies lanes of the link on which the one or more errors appear.

In at least one example, the error status identifies the location within the test pattern where the one or more errors were detected.

In at least one example, the control logic is to generate another instance of the test mode signal, where the other instance of the test mode signal includes an error reporting sequence encoded to identify the error status of the particular sublink, the apparatus further comprising transmitter logic to transmit the other instance of the test mode signal on another one of the sublinks.

In at least one example, the error reporting sequence in the other instance of the test mode signal retains error status information for previously determined error statuses of other sublinks of the link.

In at least one example, the error reporting sequence comprises a plurality of segments and each segment describes error status of a respective one of the sublinks.

In at least one example, the control logic is to identify a particular one of the plurality of segments in which to encode the error status of the particular sublink.

In at least one example, the particular segment is identified as pre-assigned to the particular sublink.

In at least one example, the particular segment is identified as a next unencoded one of the plurality of segments.

In at least one example, the other instance of the test mode signal includes an instance of the test pattern.

In at least one example, the test pattern included in the received test mode signal includes one or more errors and the instance of the test pattern included in the other instance of the test mode signal is sent without the one or more errors.

In at least one example, a first of a plurality of operating modes of the extension device is to be used to process the test signal, the plurality of operating modes includes another low latency mode, and the first mode is to enable decoding of the test signal.

In at least one example, the extension device comprises a retimer.

In at least one example, the error reporting sequence describes error status of each of the two or more sublinks of the link, and the apparatus further comprises logic to interpret the error reporting sequence and record error results for the link in at least one data structure.

In at least one example, the data structure comprises one or more registers is to correspond to the link.

In at least one example, the extension device comprises at least two retimers.

In at least one example, a root port device is connected to the link.

One or more embodiments may provide an apparatus, a system, a machine readable storage, a machine readable medium, hardware- and/or software-based logic, and a method to receive link training data from an endpoint device on a first port of the extension device, identify an idle link condition on a second port of an extension device, where the extension device is included on a link, and determine that another device has been disconnected based on the idle link condition and link training data, where the other device was previously connected to the link.

In at least one example, the link connects the endpoint device to other devices and the extension device is positioned between the endpoint and the other devices on the link.

In at least one example, the first port is connected to the endpoint device over a first sublink of the link and the second port is connected to a second sublink of the link, and the other device was previously connected to the second port by the second sublink.

In at least one example, the extension device comprises a retimer.

In at least one example, the retimer lacks sideband logic for determining disconnection on the link.

In at least one example, disconnection of the other device comprises a surprise disconnection.

In at least one example, the disconnect corresponds to hot-plugging a device on the link.

In at least one example, a detect mode is entered based on the determination that another device has been disconnected.

In at least one example, connectors of the second port are to be removed to scan for and establish a new connection (e.g., to a third device) on the second sublink in the detect mode.

In at least one example, the link training data comprises one or more training sequences.

In at least one example, the link training data corresponds to an attempt to recover the link.

In at least one example, the idle link condition is inferred based on a level of activity detected on the second port.

In at least one example, the link training data is received while the idle link condition is detected.

In at least one example, the first port comprises an upstream port and the second port comprises a downstream port.

In at least one example, the link comprises a connection cable.

One or more embodiments may provide an apparatus, a system, a machine readable storage, a machine readable medium, hardware- and/or software-based logic, and a method to provide a retimer to support at least two operating modes and selectively employ the modes based on conditions on a link, where the operating modes are to include at least a low latency mode and a particular mode, data is forwarded as received in the low latency mode, and data is decoded and re-encoded in the particular mode.

In at least one example, data received by the retimer in the low latency mode is not decoded and is forwarded as received.

In at least one example, the particular mode permits modification of data received by the retimer on the link.

In at least one example, the conditions comprise at least one of a type of data transmitted on the link and a link state of the link.

In at least one example, the retimer is to detect a particular one of the conditions and employ one of the operating modes based on the detected particular condition.

In at least one example, the low latency mode is to be employed when the link is detected to be in an active link state.

In at least one example, the active link state comprises an L0 state.

In at least one example, the particular mode is to be used for training sequence and ordered set data.

In at least one example, the particular mode is to be used in a link training link state.

In at least one example, the particular mode is to be used in a test mode.

In at least one example, the test mode is used to determine error status of each of a plurality of sublinks of the link.

In at least one example, the link uses a PCIe-based protocol.

One or more embodiments may provide an apparatus, a system, a machine readable storage, a machine readable medium, hardware- and/or software-based logic, and a method to provide an extension device to include physical layer logic, where the physical logic includes a logical physical sublayer and an electrical physical sublayer, the extension device is included on a link, the electrical physical sublayer includes a speed detection module to detect transmission speed of data on the link, and the electrical physical sublayer is to communicate detected transmission speed of the link to the logical physical sublayer.

In at least one example, the extension device comprises a retimer device.

In at least one example, the transmission speed is to be detected to be one of a predefined set of speeds for the link.

In at least one example, the set of speeds include a 2.5 GT/s speed, a 5 GT/s speed, and a 8 GT/s speed.

In at least one example, the speed detection module comprises an analog speed detection module.

In at least one example, the speed detection module is implemented at least in part in hardware.

In at least one example, the link comprises a PCIe-compliant link.

One or more embodiments may provide an apparatus, a system, a machine readable storage, a machine readable medium, hardware- and/or software-based logic, and a method to receive data at an extension device on a link that connects a first endpoint to a second endpoint and the extension device is placed between the first and second endpoints on the link, detect a transmission speed of the data using a speed detection circuit implemented in hardware of the extension device, communicate the detected transmission speed to physical layer logic of the extension device, and use the extension device to communicate the data at the transmission speed over the link from a first device to a second device.

In at least one example, the detected transmission speed is communicated to the physical layer logic using a physical layer interface between an electrical physical sublayer and a logical physical sublayer of the extension device.

In at least one example, the physical layer interface comprises a PHY Interface for PCI Express (PIPE) interface.

In at least one example, detecting the transmission speed comprises detecting that the transmission speed is one of a set of pre-defined speeds supported for the link.

In at least one example, an idle condition is identified on the link, and the transmission speed is to be detected following the idle condition.

In at least one example, the data comprises link training data and the transmission speed is to be detected from the link training data.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the invention as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

What is claimed is:

1. An apparatus comprising:
control logic to:
   generate a test mode signal to include a test pattern and an error reporting sequence; and
transmitter logic to:
   send the test mode signal on a serial, point-to-point link implemented on a physical transmission medium, wherein the link couples a first device to a second device, the link is compliant with a Peripheral Component Interconnect Express (PCIe)-based interconnect protocol, and the link is to comprise a retimer device and two sublinks coupled to the retimer, wherein the retimer is positioned between the first and second devices on the link, the test mode signal is to be sent on a particular one of the two sublinks, the test pattern is to be used by a receiving device to identify errors on the particular sublink, and the error reporting sequence comprises an ordered set based on the PCIe-based protocol and is to be encoded with error information to describe error status of sublinks in the two sublinks.

2. The apparatus of claim 1, wherein the test mode signal is sent within a loopback test mode and instances of the test mode signal are to be sent from the first device on the link over the retimer device to the second device and further sent from the second device over the retimer device back to the first device.

3. The apparatus of claim 1, further comprising receiver logic to receive at least one of the instances of the test mode signal from the second device on another one of the two sublinks of the link, wherein each instance of the test mode signal includes an instance of the test pattern and an instance of the error reporting sequence.

4. The apparatus of claim 3, further comprising error detection logic to determine one or more errors on the other sublink based on the instance of the test pattern.

5. The apparatus of claim 4, wherein errors are determined for a sublink based on an identification that an instance of the test pattern as included in a test mode signal received over the sublink deviates from an expected value for the test pattern.

6. The apparatus of claim 1, wherein the apparatus comprises the retimer.

7. The apparatus of claim 1, wherein the error reporting sequence comprises a plurality of segments and each segment describes error status of a respective one of the sublinks.

8. The apparatus of claim 7, wherein each segment describes one of a downstream channel and an upstream channel of a respective sublink.

9. The apparatus of claim 7, wherein each segment comprises one or more ordered sets and at least a portion of each ordered set in the one or more-ordered sets is to be encoded to identify error status of at least one of the sublinks.

10. The apparatus of claim 9, wherein each ordered set comprises a respective skip (SKP) ordered set.

11. The apparatus of claim 7, wherein the link comprises at least two extension devices and at least three sublinks, and the plurality of segments comprise at least five segments.

12. The apparatus of claim 1, wherein the error reporting sequence comprises error information for one or more of the sublinks of the link, and the error information includes one or more of: a number of errors detected for one of the sublinks, a lane of the link on which an error appeared, and a location of errors detected in a received test pattern.

13. The apparatus of claim 1, wherein the test pattern comprises a predefined pattern to be regenerated at each sublink during a test.

14. The apparatus of claim 13, wherein the test pattern includes one or more ordered sets.

15. The apparatus of claim 14, wherein the one or more ordered sets comprise electrical idle exit sequence ordered set (EIEOS).

16. The apparatus of claim 1, wherein the control logic is to identify that the link is in a test mode, and the test mode signal is sent in accordance with the test mode.

17. A method comprising:
identifying that a serial, point-to-point link is to enter a test mode, wherein the link connects a first device to a second device and is implemented on a physical transmission medium, the link is compliant with a Peripheral Component Interconnect Express (PCIe)-based protocol, and the link comprises a retimer device positioned between the first and second devices on the link and two or more sublinks to couple the first and second devices to the retimer device, wherein the retimer device extends physical length of the link;
generating a test mode signal, wherein the test mode signal includes a test pattern and an error reporting sequence and the error reporting sequence is to be encoded with error information to describe error status of sublinks in the plurality of sublinks, wherein the error reporting sequence comprises an ordered set based on the PCIe-based protocol; and
sending the test mode signal within the test mode on a particular one of the sublinks.

18. A system comprising:
a first device;
a second device communicatively coupled to the first device using a serial, point-to-point link, wherein the link comprises a plurality of physical lanes and is compliant with a Peripheral Component Interconnect Express (PCIe)-based interconnect protocol;
a retimer device included on the link, wherein the retimer device is positioned between the first and second devices on the link, and data is sent between the first and second devices on the link over the retimer device; and
test mode logic to:
send test mode signals within a test mode of the link, wherein the link comprises a plurality of sublinks connected to the retimer, each instance of the test mode signal corresponds to a test of a respective one of the sublinks and includes a test pattern and an error reporting sequence, the test pattern is to be used by a device receiving the test mode signal to identify errors on the corresponding sublink, and the error reporting sequence comprises an ordered set based on the PCIe-based protocol and is to be encoded with error information to describe error status determined for the sublinks.

19. The system of claim 18, wherein the test mode logic is further to:
receive test mode signals and assess the test pattern in the test mode signal to identify an error status of the sublink corresponding to the test mode signal.

20. The system of claim 19, wherein each of the retimer device and the first device include a respective instance of the test mode logic.

21. The system of claim 20, wherein the second device also includes an instance of the test mode logic.

22. The system of claim 18, further comprising reporting logic to record error status information for the plurality of sublinks determined from the test mode signals and included in the error reporting sequences in one or more registers corresponding to the link.

23. The system of claim 18, wherein the link includes at least two retimers positioned between the first and second devices.

* * * * *